US008143946B2

(12) United States Patent
Aram

(10) Patent No.: US 8,143,946 B2
(45) Date of Patent: Mar. 27, 2012

(54) CURRENT TO VOLTAGE CONVERTER

(75) Inventor: Farbod Aram, Los Altos Hills, CA (US)

(73) Assignee: Project FT, Inc., Mountain View, CA (US)

( * ) Notice: Subject to any disclaimer, the term of this patent is extended or adjusted under 35 U.S.C. 154(b) by 0 days.

(21) Appl. No.: 12/900,832

(22) Filed: Oct. 8, 2010

(65) Prior Publication Data

US 2011/0025418 A1 Feb. 3, 2011

Related U.S. Application Data

(60) Continuation of application No. 12/798,375, filed on Apr. 2, 2010, now Pat. No. 7,834,691, which is a division of application No. 11/904,604, filed on Sep. 26, 2007, now Pat. No. 7,764,124.

(60) Provisional application No. 60/827,033, filed on Sep. 26, 2006.

(51) Int. Cl.
*H03F 3/45* (2006.01)
(52) U.S. Cl. ................ 330/253; 330/264; 330/265
(58) Field of Classification Search .............. 330/253, 330/264, 265
See application file for complete search history.

(56) References Cited

U.S. PATENT DOCUMENTS

| | | | | | |
|---|---|---|---|---|---|
| 3,479,553 | A | * | 11/1969 | Yanishevsky et al. | 315/397 |
| 5,537,079 | A | * | 7/1996 | Gosser et al. | 330/265 |
| 5,838,031 | A | * | 11/1998 | Kobayashi et al. | 257/197 |
| 5,838,807 | A | * | 11/1998 | Andersson et al. | 381/321 |
| 6,696,888 | B2 | * | 2/2004 | Gilbert | 327/560 |
| 6,801,084 | B2 | * | 10/2004 | Smith et al. | 330/98 |
| 7,425,871 | B2 | * | 9/2008 | Gao et al. | 330/289 |
| 7,940,122 | B2 | * | 5/2011 | Satou | 330/282 |
| 7,952,430 | B1 | * | 5/2011 | Beffa | 330/86 |
| 2007/0040609 | A1 | * | 2/2007 | Taylor | 330/85 |

* cited by examiner

*Primary Examiner* — Patricia Nguyen
(74) *Attorney, Agent, or Firm* — Van Pelt, Yi & James LLP

(57) ABSTRACT

A current to voltage converter which includes a common gate transconductance element having at least one input and one output. The current to voltage converter further includes a common source transconductance element having at least one input and one output, where the common source transconductance element is connected to the common gate transconductance element. The current to voltage converter further includes a feedback circuit including a resistor, where the feedback circuit connects any input having a polarity to any output having an opposite polarity.

6 Claims, 31 Drawing Sheets

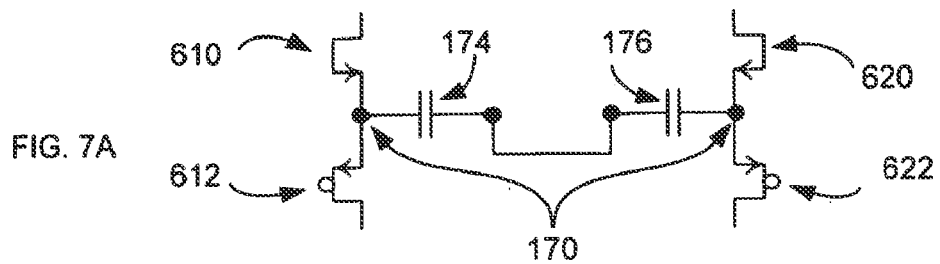
FIG. 7A
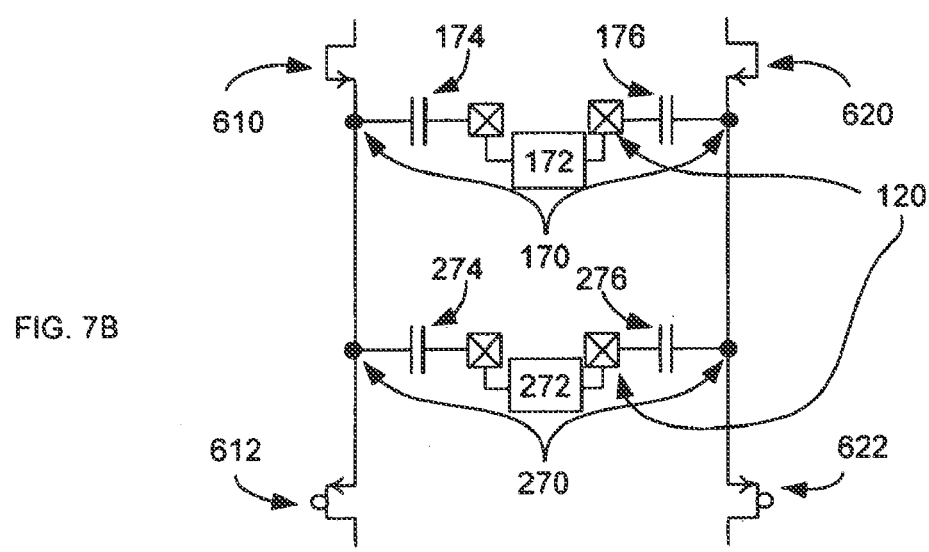
FIG. 7B
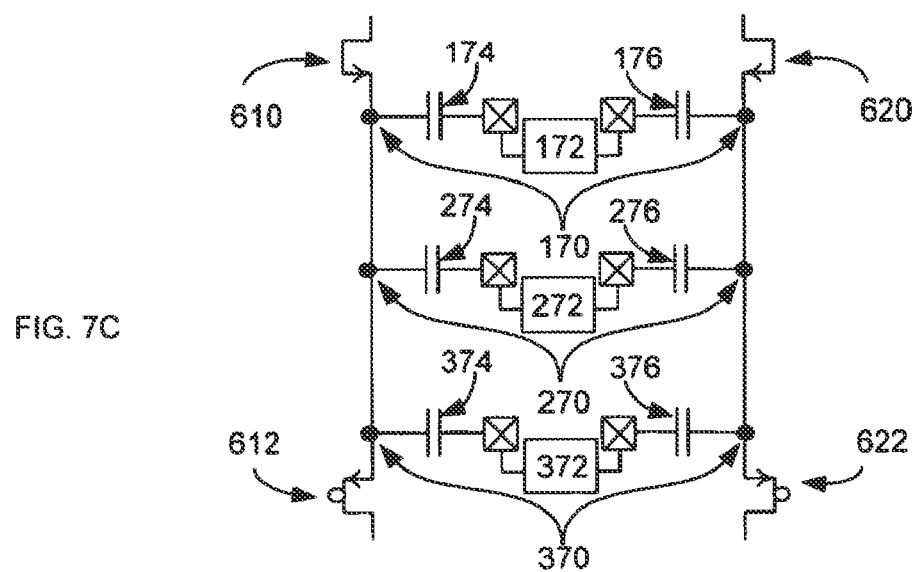
FIG. 7C
FIG. 7

CURRENT TO VOLTAGE CONVERTER

CROSS REFERENCE TO RELATED APPLICATIONS

This application claims the benefit of U.S. Provisional Application 60/827,033, "Method and System for Tuned CMOS Low Noise Amplifier," filed Sep. 26, 2006, which is incorporated herein by reference.

BACKGROUND

1. Technical Field

The present invention relates generally to the amplification of radio frequency signals.

2. Description of Related Art

A variety of applications require the amplification of RF (radio frequency) signals with minimum noise. Signals may be received via single ended inputs or differential inputs, and often these amplification processes should be performed with low power. Amplification to high bandwidth may also be desirable. Typically, low noise amplifiers provide for at least some decoupling of the noise of the amplification circuit from the impedance of the amplification circuit. However, this decoupling often requires high power. Improved circuits for transconductance and low noise amplification are needed.

SUMMARY OF THE INVENTION

Embodiments include a transconductance circuit having an n-type transistor and a p-type transistor, in which the source of the n-type transistor is connected to the source of the p-type transistor, and one or more resistive loads are disposed. Each load is connected to the drain of either the n-type transistor or the p-type transistor, and each load allows passage of a current without limiting current. A bridge may connect one end to at least one source, an input to the circuit connects to at least one gate, and an output to from the circuit connects to at least one drain. Input and output connections are made to transistors that are connected to a load.

In other embodiments, transconductance circuits including n-type and p-type transistors are provided. The source of the n-type transistor is connected to the source of the p-type transistor. One or more resistive loads are present, and each load is connected to the drain of either transistor. Each load allows passage of a current without limiting current. A bridge may connect one end to at least one gate; an input to the circuit connects to at least one source, and an output from the circuit connects to at least one drain of a transistor connected to a load.

Various embodiments of transconductance circuits and transconductance elements may not require a current source.

In various embodiments, bridges of different circuits may be connected to each other. In other embodiments, bridges connect different components of two different transistors (e.g. a source of one transistor to a gate of another transistor). In various embodiments, bridges may include a tune block having an impedance.

In certain embodiments, tuning is provided for by the incorporation of a tune block in a bridge, feedback circuit, input and/or output, and in certain cases, the tune block may be physically disposed outside of the chip upon which the circuit is fabricated.

Some embodiments provide for a cross coupled transconductance element having an input and output. The transconductance element is composed of two transconductance circuits, and, each circuit includes both n-type and p-type transistors, and the source of the n-type transistor is connected to the source of the p-type transistor. An input to the transconductance element connects to at least one source, and output to the transconductance element connects to at least one drain. The drains of the transistors are connected, as are the gates. A bridge connects a gate of the first circuit to a source of the second circuit, and another bridge connects a gate of the second circuit to the source of the first circuit. In some implementations, devices can be used as single ended to differential converters. In other implementations, devices can provide noise cancellation. In various embodiments, a tune block having an impedance can be incorporated.

Certain embodiments provide for a tuned transconductance element having an input and an output. The transconductance element includes two transconductance circuits, each of which contains an n-type and a p-type transistor. An input to the element connects to at least one gate, and an output to the element connects to at least one drain. In each circuit, the drain of the n-type transistor is connected to the drain of the p-type transistor, and the gate of the n-type transistor is connected to the gate of the p-type transistor. A bridge connects a source of one circuit to a source of the other circuit, and in some embodiments, this bridge may include a tune block having an impedance.

Various embodiments provide for a tuned transconductance element including a first and second transconductance circuit. Each circuit includes a first n-type transistor and a second n-type transistor, and an input to the element connects to the gate of the first transistor. An output to the element connects to the drain of the first transistor. The source of the first transistor is connected to the drain of the second transistor at a junction. A resistor connects the drain of the first transistor and the gate of the second transistor, and a capacitor connects the gate of the second transistor and ground. The element provides for a bridge connecting the junctions of each transconductance circuit. In some embodiments, the bridge includes a tune block having an impedance.

Some embodiments provide for a tuned transconductance element including first and second transconductance circuits. Each circuit includes an n-type and a p-type transistor, and the drains of these transistors are connected. An input to the element connects to at least one source, and an output to the element connects to at least one drain. In each circuit, the gate of the n-type transistor is connected to the gate of the p-type transistor. The element also includes a bridge connecting at least one gate of the first circuit to at least one gate of the second circuit. In some embodiments, the bridge includes a tune block having an impedance.

Certain embodiments provide for a low noise amplifier. Components of various low noise amplifiers include various transconductance circuits and transconductance elements. Low noise amplifiers also include one or more feedback circuits, each of which includes a resistor. Each feedback circuit connects an input to an output having opposite polarity. In general, resistors included in a feedback circuit may be switchable resistors, and in some implementations, the switching of resistance in feedback circuits may be used to modify gain while maintaining impedance of the device at a desired value. In certain implementations, feedback circuits may include a tune block having an impedance. Any of these tune blocks may be used to tune the circuit, element, amplifier or other device incorporating the tune block. For various implementations, a tune block may be located in a location physically disposed away form the circuitry being tuned.

Certain implementations provide for the incorporation of a buffer circuit with various circuits, elements and amplifiers.

In some embodiments, feedback circuits can include feedback around the buffer circuit.

Some embodiments provide for a tuning circuit, used to tune the response of a circuit to a band of interest, according to the impedance and capacitance of the tuning circuit. The tuning circuit connects two or more transistors, by connecting the source, drain or gate of one transistor to the source, drain or gate of another transistor. The tuning circuit includes a tune block having an impedance. In various embodiments, multiple tune circuits are provided, making a parallel connection between two transistors. By incorporating tune blocks having different impedances in each tune circuit, the circuit can be tuned to respond to multiple frequency bands, according to the impedance of each tune circuit. A large number of tune circuits can be incorporated, providing for tuned response in a large number of bands.

Other embodiments provide for a low noise amplifier including a common gate transconductance element. The amplifier also includes two or more feedback circuits. One feedback circuit connects a positive input to the element to a negative output, and another feedback circuit connects a negative input to the element of a positive output. Feedback circuits include feedback resistors. Feedback circuits may generally include bypass capacitors. Feedback circuits may also include tune blocks having an impedance.

Certain embodiments provide for a current to voltage converter. A current to voltage converter can include a common gate transconductance element, a common source transconductance element connected to the common gate transconductance element, and at least one feedback circuit including a feedback resistor and optionally a capacitor. A feedback circuit connects at least one input of a transconductance element to an output having opposite polarity. In some embodiments, current to voltage converters also include a buffer circuit, and this buffer circuit may also include feedback circuits in connection with other transconductance elements.

Other embodiments provide for a low noise amplifier including a first, common source transconductance element connected to a common gate transconductance element. A second common source transconductance element is connected to the common gate transconductance element. At least one feedback circuit, including a feedback resistor, connects the input of any transconductance element to the output of another transconductance element, the input and output having opposite polarity. Certain embodiments of low noise amplifiers include a buffer circuit, and in some implementations, feedback circuits can include the buffer circuit.

Other implementations provide for a buffer circuit comprising an n-type transistor and a p-type transistor. The sources of the transistor are connected by a resistor. The sources are also connected by a capacitor. An input to the circuit connects to at least one gate, and an output from the circuit connects to at least one source.

Various embodiments, provide for a tuned, cross coupled transistor circuit comprising two transistors. The gate of the first transistor is connected to the source of the second transistor by a bridge, and the gate of the second transistor is connected to the source of the first transistor by a bridge. The bridges include tune blocks, and each tune block has an impedance.

Further embodiments provide for an active resistive load circuit, capable of passing current without being current limiting. A circuit may include a transistor having a source connected to either a power supply or to ground. A capacitor connects the source and the gate of the transistor, and a resistor connects the gate and drain of the transistor. A device to which the circuit provides a load may be connected to the drain of the circuit.

Other embodiments provide for a wrapping circuit. In some implementations, a wrapping circuit may provide a high impedance connection between a device and another component in a circuit such as a ground or a power supply. Other aspects may protect the device from ground noise or power supply noise. A wrapping circuit may include a transistor, and the source of the transistor is connected to the component such as ground or power supply. The drain of the transistor is connected to a first connection of the device being wrapped. The wrapping circuit also includes a capacitor. The capacitor is connected on a first end to the component, and connected on a second end to the gate of the transistor. A resistor is connected on a first end to the second end of the capacitor, and the resistor is connected on a second end to a second connection of the device.

Various embodiments of the invention can provide impedance matching to antennae, filters, duplexers or other upstream signal sources. Broadband amplification and tuned amplification may be provided. In the case of tuned amplification, large components such as inductors can be located off chip. Differential inputs and single ended inputs can be amplified. In the case of single ended input, implementations may be more immune to ground noise than other amplifiers and transconductance elements.

Linearity of some transconductance elements may be high, particularly at inputs near zero. Linearity may also be high to high bandwidth, and in some cases, this can reduce the manifestation of extra tones in the frequency domain. In some embodiments of transconductance elements, both n-type and p-type transistors operate on both positive and negative input signals.

Input signals may be amplified with minimal noise addition. For tuned applications, amplification is only performed in the tuned band; noise outside the band is not amplified. Gain may be maintained to high frequencies, and in some embodiments there is a high signal to noise ratio. Noise generation is done without compromising gain. Aspects feature high Q, and additional filtering can be used to further sharpen Q if so desired.

Various embodiments may provide very low output impedance, which can be useful when combined with downstream components having high frequency noise. Other embodiments provide for high swing, in some cases from rail to rail.

Still further embodiments provide for variable gain, switchable by a user, and devices can be made to operate using low power requirements.

BRIEF DESCRIPTION OF THE DRAWINGS

FIGS. 7A, 7B and 7C show several exemplary bridges according to one embodiment of the invention.

DETAILED DESCRIPTION OF THE INVENTION

Typically, broadband amplification of radio frequency signals (after their having been received by an appropriate antenna device) refers to amplification over a range of frequencies much larger than the typical band of frequencies associated with a specific communications protocol (e.g. the analog TV band, the CDMA band, the GSM band, the GPS band, the 802.11 band and the like). Thus, "broadband" includes frequencies from fractions of 1 Hz to at least 4 GHz. The present invention can extend amplification far beyond 4 GHz, and is presently limited by the process technology used for circuit manufacture (e.g. CMOS process technology for CMOS circuitry). As process technology improves, the invention is expected to amplify signals at 6 GHz, 12 GHz, 24 GHz or even higher frequencies.

Figure 1:
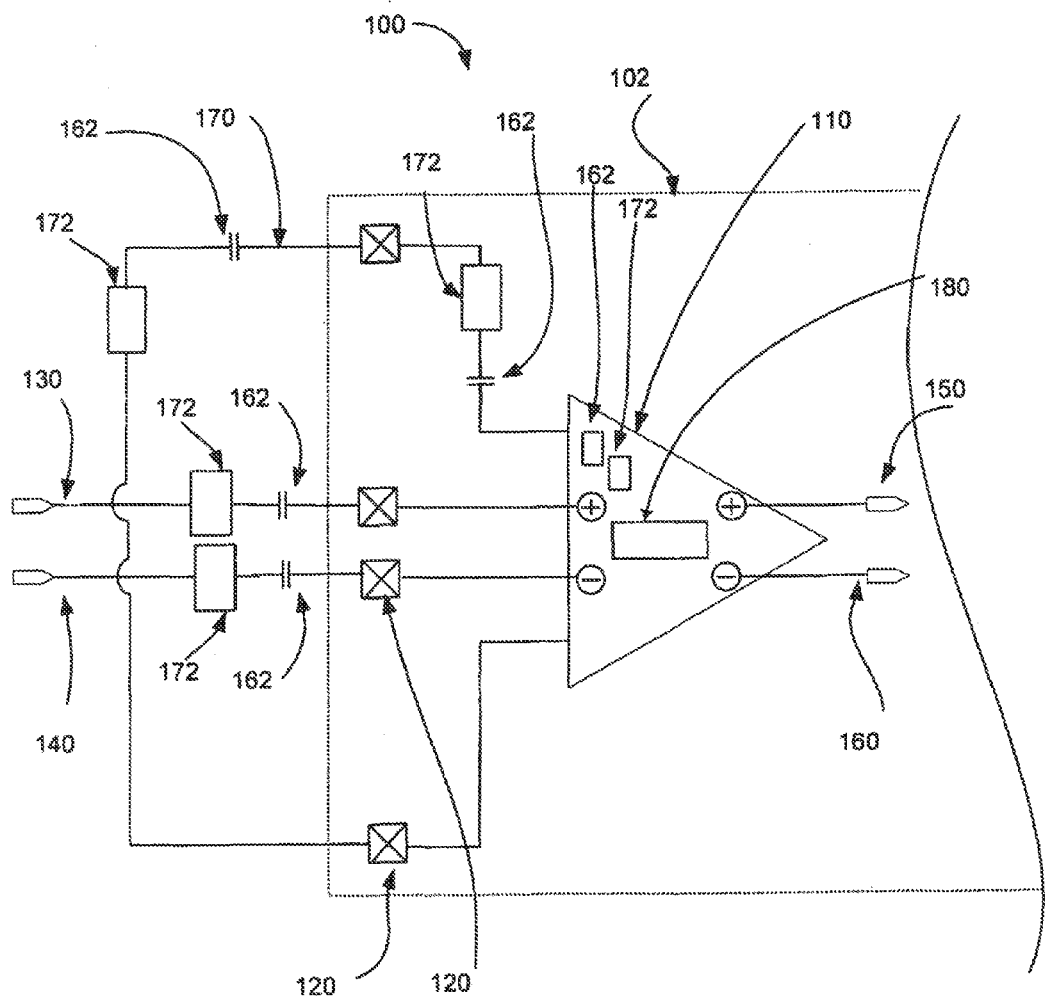
FIG. 1 is a block diagram of an exemplary low noise amplifier having a single bridge according to one embodiment of the invention.

FIG. 1 is a block diagram of Low Noise Amplifier (LNA) 100 according to one embodiment of the present invention. LNA 100 includes LNA Core 110, which includes Feedback Components 180, and Bridge 170. In this example, a portion of Bridge 170 is inside LNA Core 110 and a portion is outside LNA Core 110. In general, each amplifying component such as a low noise amplifier (LNA), op-amp, transconductance element and the like is demarcated herein using standard (+) and (−) symbols to denote inversion (or lack thereof) performed by the device on a given input signal prior to output.

Figure 26:
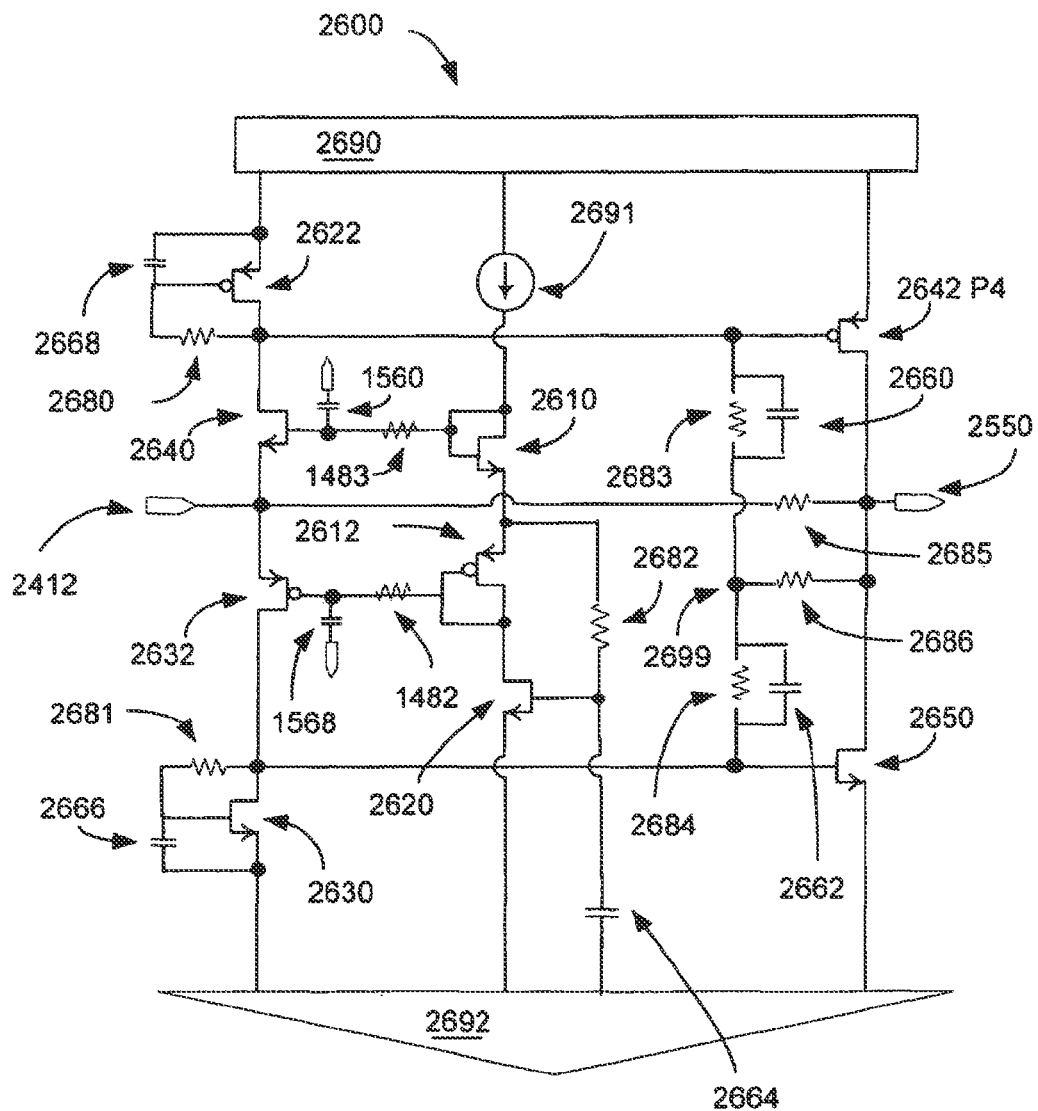
FIG. 26 is a schematic of a broadband current to voltage converter incorporating first and second gain stages, bias circuits, feedback circuits, transistor loading circuits and optional cross coupling circuits according to one embodiment of the invention.

Package 102 comprises LNA Core 110 and several Pads 120 providing points of electrical contact to Package 102 from the outside of Package 102. In this example, Pads 120 provide for the input of A/C signals as well as connection to part of Bridge 170 located outside Package 102. Thus, a portion of Bridge 170 passes outside Package 102 in this example. Bridge 170 includes Capacitor 162 and Tune Block 172. For illustrative purposes, several possible locations for Capacitor 162 and Tune Block 172 are shown in FIG. 1. Bridge 170 may include Capacitor 162 and Tune Block 172 located outside of LNA Core 110, although any and/or all of these components may be located inside LNA Core 110, located on Package 102, or located outside of Package 102 as desired. Thus, FIG. 26 shows locations of Tune Block 172 and Capacitor 162 as part of Package 102 and as part of LNA Core 110, although typical instances of Bridge 170 would not necessarily have all of these components in all of the locations illustrated on FIG. 1.

Tune Block 172 can have zero impedance (i.e. be a simple connection) providing for broadband amplification. For tuned applications, Tune Block 172 can include an impedance circuit, and/or may include an inductor. For some embodiments of Tune Block 172 including impedance circuits, it may be convenient to locate Tune Block 172 outside of Package 102. Bridge 170 can include other components (e.g. capacitors)

that may be located either outside Package 102 or inside Package 102, or even on the same chip as LNA Core 110. Although Bridge 170 may be used to tune LNA 100 to a specific frequency band, Bridge 170 performs other functions also, and so is generally a component of LNA 100 even though LNA 100 may be used for broadband amplification (i.e. not be tuned).

FIG. 1 also illustrates several alternative options for the incorporation of tuning. Tune Block 172 and Capacitor 162 can be incorporated into either or both of the input signal paths. In FIG. 1, an example of this incorporation is illustrated by the optional incorporation of Tune Block 172 and Capacitor 162 in the In+ 130 signal path. As discussed later, tune blocks such as Tune Block 172 and capacitors such as Capacitor 162 may also be incorporated into one or more feedback circuits. In any of these tuning configurations, Tune Block 172 and/or Capacitor 162 may be incorporated onto the chip upon which LNA Core 110 is fabricated, onto Package 102, or outside Package 102. Additionally, other amplifiers, transconductance elements, transimpedance elements or other circuitry can also be modified to provide tuned response by the incorporation of any of the embodiments of Tune Block 172 and/or Capacitor 162 described herein.

Positive voltage input In+ 130 is an input to LNA Core 110. Negative voltage input In− 140 is another input to LNA Core 110. In+ 130 and In− 140 receive input signals (e.g. from an antenna, filter, duplexer, inductor, resistor or other upstream component). The combination of In+ 130 and In− 140 may be used to receive a differential input. Optionally, either of In+ 130 or In− 140 may be grounded to provide for a single ended input (into the ungrounded input). The output of LNA 100 is via Out+ 150 and Out− 160. Out+ 150 is not inverted with respect to the input signal In+ 130, and Out− 160 is not inverted with respect to the input signal In− 140.

In some aspects, it may be advantageous to physically dispose certain electrical components (e.g. Tune Block 172 and/or circuitry directed toward pre-processing the signals for In+ 130 and/or In− 140) outside Package 102. In some embodiments, capacitors such as Capacitor 162, or any other capacitor in this description, may be optional.

Figure 2:
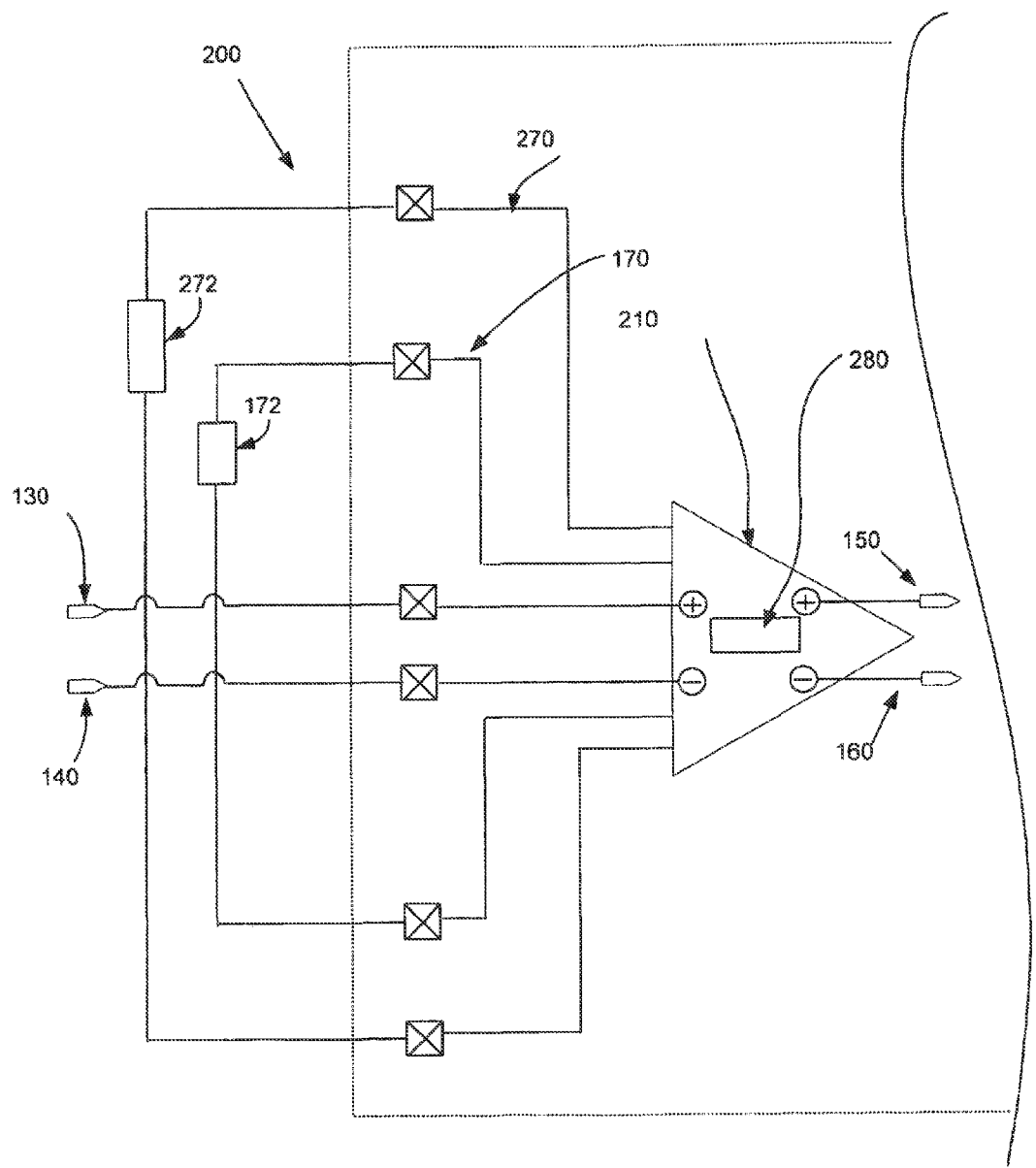
FIG. 2 is a block diagram of an exemplary low noise amplifier having two bridges according to one embodiment of the invention.

FIG. 2 shows an embodiment having two bridges. LNA 200 includes LNA Core 210, Bridge 170 and Bridge 270. LNA Core 210 includes Feedback Components 280. As with LNA 100, components of any bridge can be located on chip, on package, or outside of the package upon which the device is mounted. Similarly, any number of bridges can be incorporated into various embodiments.

Bridge 170 includes Tune Block 172, and Bridge 270 includes Tune Block 272. Typically, Tune Block 272 tunes LNA 210 to a different frequency band than Tune Block 172. By using both Bridge 170 and Bridge 270, LNA 210 can be tuned to process signals in two separate bands (while excluding other bands). The tuned bands may correspond to the impedances of Tune. Block 172 and Tune Block 272, respectively.

Any number of bridges can be incorporated into an LNA Core as desired. Two, four, eight or even twenty bridges can provide the ability to tune to two, four, eight or twenty frequency bands, respectively, as desired by the tuning requirements of the user. Alternately, shorting any bridge (i.e. setting the impedance of the relevant tune block equal to zero) provides for broadband amplification.

Implementations that have been designed for differential input may be modified for use with single ended input sources if so desired, for example by grounding the input that does not receive the single ended input. For example, LNA 100 may be modified for single ended use by grounding an input (e.g. In− 140). In some embodiments, the first gain stage can also function as a single ended to differential converter.

Figure 3:
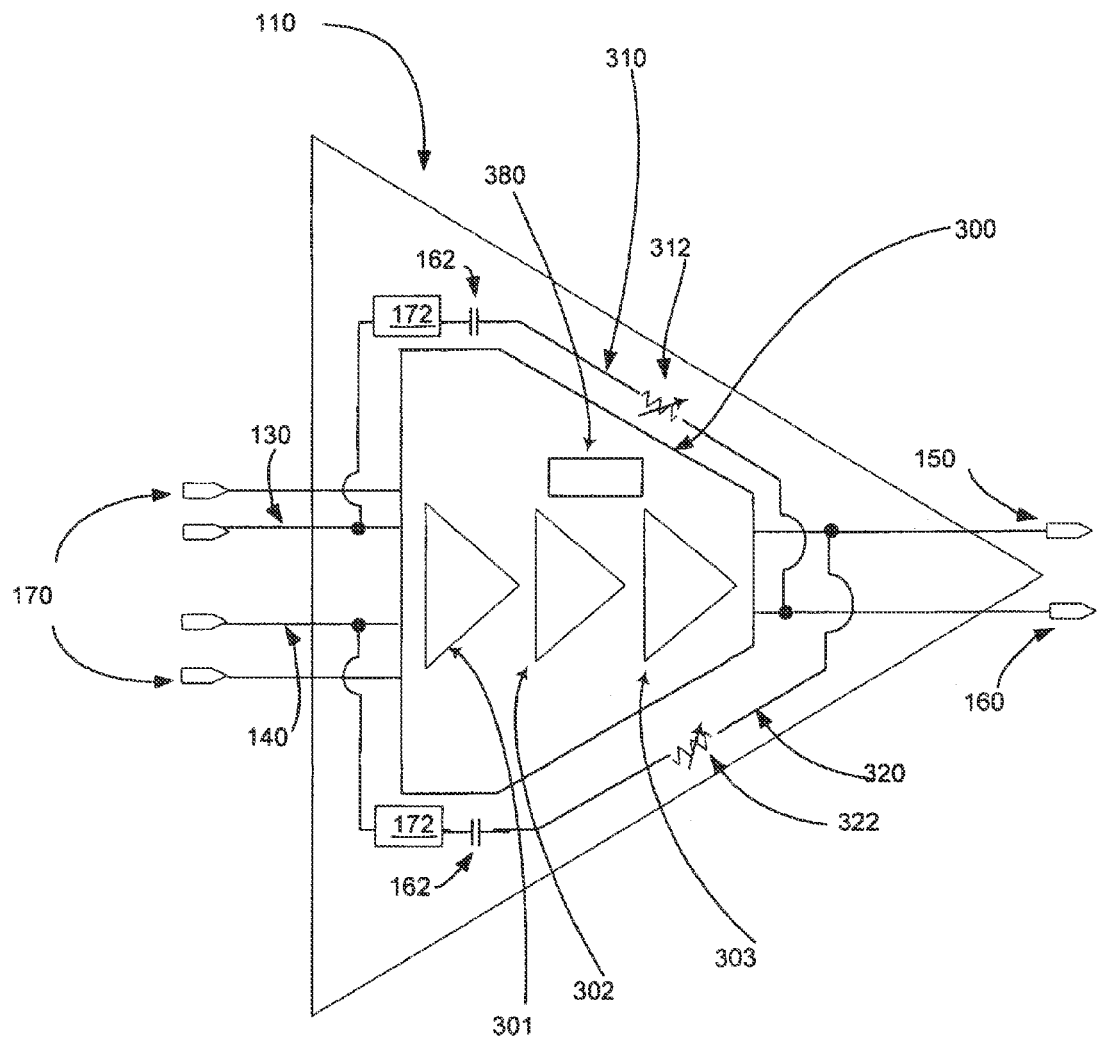
FIG. 3 is a block diagram of an exemplary LNA core according to one embodiment of the invention.

FIG. 3 is a more detailed block diagram of exemplary LNA Core 110. LNA Core 110 includes BBV2V 300, which is a noninverting broadband voltage to voltage converter (in configurations where a tune block has zero impedance). LNA Core 110 also features two feedback circuits, Feedback Circuit 310 and Feedback Circuit 320, along with additional Feedback Components 380. BBV2V 300 receives inputs In+ 130 and In− 140, and outputs Out+ 150 and Out− 160. In this example, BBV2V 300 includes Bridge 170, and a portion of Bridge 170 passes outside BBV2V 300, and other components of Bridge 170 are not shown.

In+ 130 is connected to Out− 160 via Feedback Circuit 310, which includes variable resistor Rf 312. In− 140 is connected to Out+ 150 via Feedback Circuit 320, which includes switchable resistor Rf 322. Each of Feedback Circuits 310 and 320 can also include multiple resistors and the circuitry to switch between these resistors. Incorporating nonvariable resistors instead of variable resistors is also possible. Changing the resistance of the Feedback Circuits 310 and 320 along with changes in Feedback Components 380 can be used to change the gain of LNA 100 while keeping the impedance presented at In+ 130 and In− 140 relatively constant. Because BBI2V 300 is noninverting, these exemplary feedback circuits connect each input to an output having opposite polarity (i.e. a positive input is connected to a negative output).

This example of BBV2V 300 features three gain stages, connected in series (connections not shown). Gm1 301 is the first gain stage, and receives In+ 130 and In− 140. Gm1 301 electrically includes Bridge 170, although as previously described parts of Bridge 170 can physically pass outside of Gm1 301. The output of Gm1 301 is used as the input to Gm2 302, the second gain stage. The output of Gm2 302 is used as the input to Gm3 303. In this example, the output of Gm3 303 is Out+ 150 and Out− 160.

Other embodiments provide for a Gm1 stage that receives single ended input and outputs single ended output. In some of these cases, second gain stages (e.g. a Gm2 stage) having a cross coupling circuit may be used as single ended to differential converters, providing differential output to a third gain stage.

FIG. 3 also illustrates additional options where tuning can be implemented (e.g. via the incorporation of Tune Block 172 and Capacitor 162). FIG. 3 illustrates the incorporation of Tune Block 172 and Capacitor 162 into Feedback Circuits 310 and 320. In general, any of the feedback circuits described herein (e.g. below) may be modified to include Tune Block 172 and/or Capacitor 162. As with other such examples of incorporation, Tune Block 172 and/or Capacitor 162 may be located on the chip upon which the device is fabricated, on the package upon which the device is packaged, off the package, or any other location. Thus in several embodiments, a portion of any circuit that provides for tuning may be located in a physical region other than the region where the device being tuned is located. This decoupling between the physical location of certain components and the electrical connectivity of these components may provide for the convenient placement of particularly bulky components outside a chip or a package upon which a device is fabricated.

Even if Tune Block 172 and Capacitor 162 are not included in circuits such as Feedback Circuit 310, it may be advantageous to include a bypass capacitor in this and other circuits that may appropriately block low frequencies. In general, the incorporation of a bypass capacitor or other basic electronic component in any circuit described herein is envisioned, and the conditions under which such an incorporation is advantageous are typically well known. As a result, bypass capacitors and the like are often (though not always) omitted from various schematics in order to improve clarity in the illustration.

Figure 4:
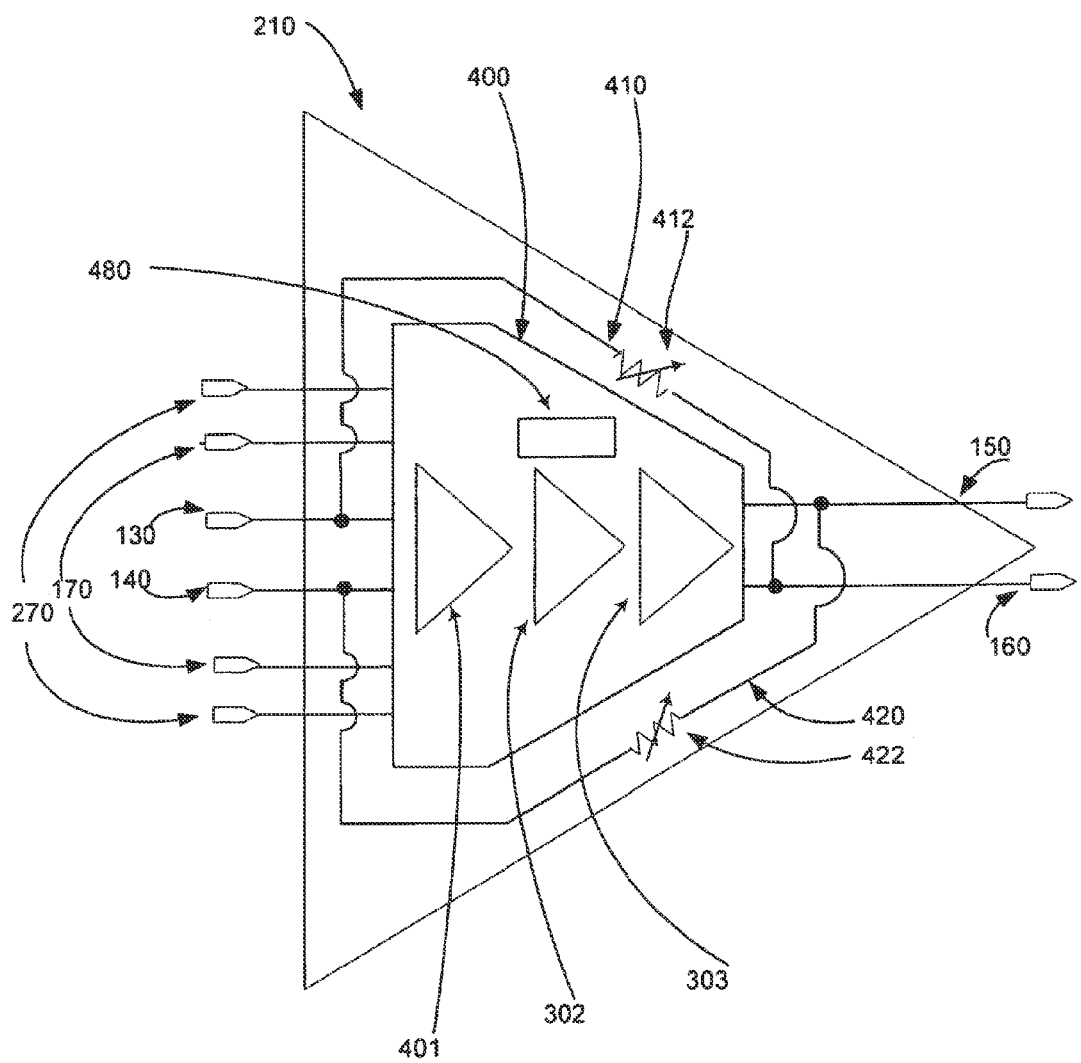
FIG. 4 is a block diagram of another exemplary LNA core according to one embodiment of the invention.

FIG. 4 is a more detailed block diagram of exemplary LNA Core 210 of FIG. 2. LNA Core 210 includes BBV2V 400, which is a noninverting broadband voltage to voltage converter. LNA Core 210 also features two feedback circuits, Feedback Circuit 410 and Feedback Circuit 420, along with additional Feedback Components 480. BBV2V 400 receives inputs In+ 130 and In− 140, and outputs Out+ 150 and Out− 160. In this example, BBV2V 400 includes Bridge 170, and a portion of Bridge 170 passes outside BBV2V 400. BBV2V 400 also includes Bridge 270, and a portion of Bridge 270 passes outside BBV2V 400.

In+ 130 is connected to Out− 160 via Feedback Circuit 410, which in this example includes switchable resistor Rf 412. In− 140 is connected to Out+ 150 via Feedback Circuit 420, which in this example includes switchable resistor Rf 422. Each of Feedback Circuits 410 and 420 can also include multiple resistors and the circuitry to switch between these resistors. Changing the resistance of Feedback Circuits 410 and 420, while similarly changing the resistances in Feedback Components 480, can be used to change the gain of LNA 200 while keeping the impedance presented at In+ 130 and In− 140 relatively constant. Generally, the resistances of all feedback resistors may be either increased or decreased together.

This example of BBV2V 400 features three gain stages, which can be described as a combination of voltage to current converter (a transconductance element) followed by a current to voltage converter (a transimpedance element). Gm1 401 is the first gain stage, and receives In+ 130 and In− 140. Gm1 401 also includes Bridge 170 and Bridge 270. The output of Gm1 401 is used as the input to Gm2 302, the second gain stage. The output of Gm2 302 is used as the input to Gm3 303. In this example, the output of Gm3 303 is Out+ 150 and Out− 160.

Further LNA detail, particularly detail of the voltage to voltage converter (e.g. BBV2V 300, BBV2V 400 or another broadband voltage to voltage converter) will be described in the context of exemplary LNA 110 and BBV2V 300. This simplification is for descriptive clarity only, and is not intended to limit the number of bridges that might be included or to limit any input tuning options.

Figure 5:
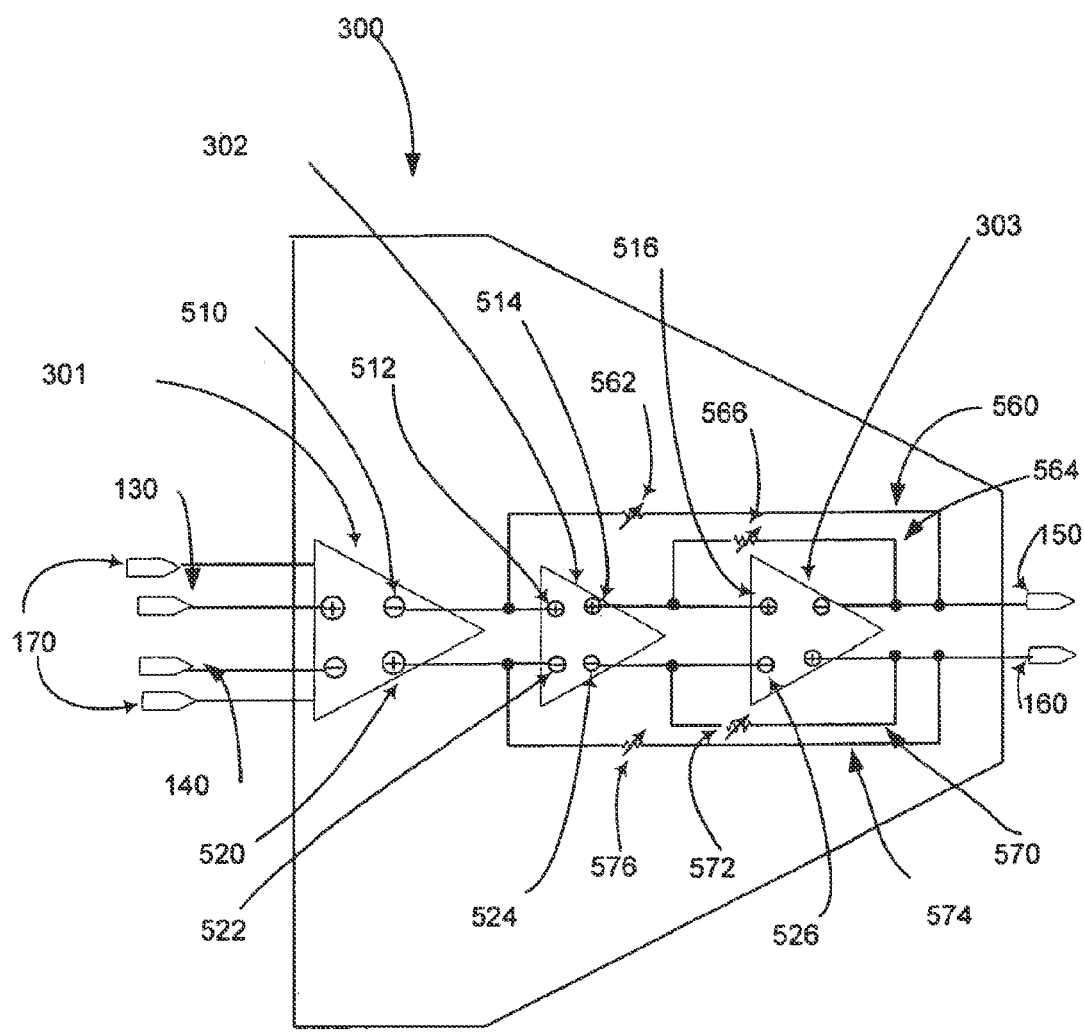
FIG. 5 is an exemplary broadband voltage to voltage converter according to one embodiment of the invention.

FIG. 5 is a more detailed block diagram of BBV2V 300, the exemplary broadband voltage to voltage converter of FIG. 3. BBV2V 300 includes Gm1 301, Gm2 302 and Gm3 303, along with several feedback circuits. In this example, Gm1 301 is an inverting, common source transconductance element. Gm2 302 is a noninverting, common gate transconductance element, and Gm3 303 is an inverting, common source transconductance element that may be a push pull transconductance element in some embodiments.

Some aspects of BBV2V 300 can also be described as a voltage to current converter (i.e. Gm1 301) followed by a current to voltage converter (in this example, the combination of Gm2 and Gm3), or alternately, as an inverting transconductance element in series with an inverting transimpedance element.

Gm1 301 receives input signals In+ 130 and In− 140, and also includes Bridge 170. The outputs of Gm1 301 are Out− 510 and Out+ 520, which are used as inputs to GM2 302, with Out− 510 becoming In− 512, and Out+ 520 becoming In+ 522. The outputs of Gm2 302 are Out− 514 and Out+ 524, which are used as inputs to Gm3 303, with Out− 514 becoming In− 516, and Out+ 524 becoming In+ 526. The outputs of Gm3 303 are Out+ 150 and Out− 160.

This example of BBV2V 300 includes four feedback circuits wrapping around Gm3 303 and both Gm2 302 and Gm3 303. Feedback Circuits 560, 564, 570 and 574 include switchable resistors Rf 562, 566, 572 and 576, respectively. Feedback Circuits 560 and 574 connect inputs and outputs of the current to voltage converter (i.e. the combination of Gm2 302 and Gm3 303). The combination of these two gain stages is inverting. Feedback circuits 564 and 570 connect the inputs and outputs of Gm3 303, which by itself is an inverting gain stage.

The combination of feedback circuits shown in FIG. 5 with feedback circuits shown in FIG. 3 creates a larger feedback circuit. This exemplary larger feedback circuit can be described as a group of feedback circuits, each connecting the output of the device to an input of every transconductance element having opposite polarity. This feedback circuit may create a broadband variable voltage gain across Feedback Circuits 310 and 320. In some embodiments, the resistances of all resistors may be increased or decreased together in order to modify gain while maintaining impedance.

A variety of existing transconductance elements can be used to fabricate Gm1 301, Gm2 302 and Gm3 303, and BBV2V 300 can be fabricated from fewer or more transconductance elements. The following paragraphs describe several examples of new transconductance elements that may be particularly useful when incorporated into an LNA such as LNA 100. These transconductance elements and associated circuitry may also be useful in other applications (i.e. other than LNA 100, LNA 200 and the like), and LNA 100 can incorporate transconductance elements other than those described below. Unless otherwise specified, transistors having names beginning with "N" are n-type transistors, and transistors having names beginning with "P" are p-type transistors.

Figure 6:
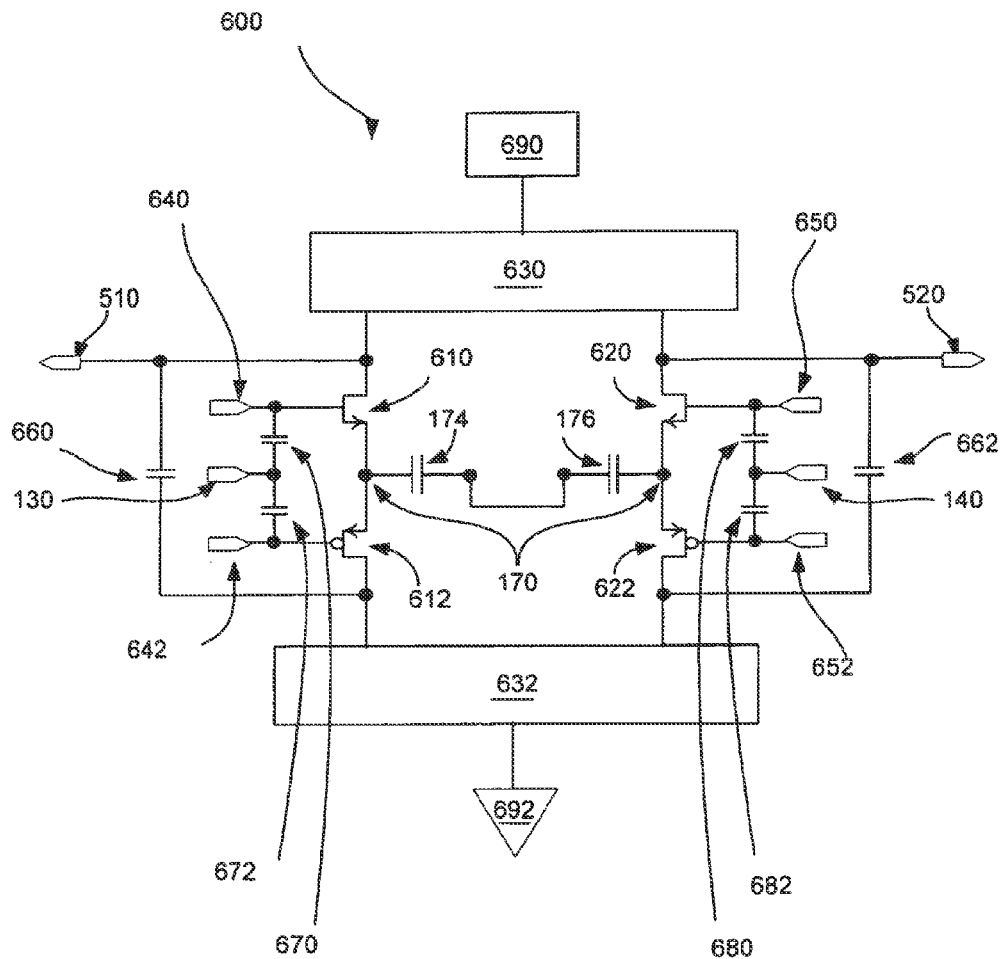
FIG. 6 is an exemplary first gain stage, showing a common source linear transconductance element according to one embodiment of the invention.

FIG. 6 is an example of one type of common source transconductance element appropriate for use in Gm1 301. One advantage of many transconductance elements is the linearity of the gain from input voltages close to zero to very high input voltages. While high linearity over a broad range of input is desirable, it may also be desirable to maintain high linearity for inputs near zero or near crossover. Many existing transconductance elements show a "kink" or other nonlinearity in their response near zero input, while several of the transconductance elements described herein remain more linear near zero input. Some embodiments may display superior IIP3 (third order intercept point) behavior than existing transconductance or transimpedance elements, and in some implementations, IIP3 greater than 5 dBm may be achieved. In some embodiments, transconductance elements use a combination of n-type and p-type transistors for both positive and negative inputs. In other embodiments, transconductance elements use a combination of pairs of n-type and p-type transistors, arranged such that at least one n-type and one p-type transistor combine to provide transconductance even as polarity of the input signal changes. Thus for the purposes of this specification, a linear transconductance element has a particularly high linearity (relative to existing transconductance elements) in the regime close to zero input voltage. In some embodiments, this linearity is achieved by combining the functionality of both n-type and p-type transistors on both positive and negative input polarities.

CSLTE 600 is a common source linear transconductance element, powered by Power Supply 690 via NLoad 630, and grounded to Ground 692 via PLoad 632. CSLTE 600 receives inputs In+ 130 and In− 140, and outputs Out− 510 and Out+

520. CLSTE 600 includes n-type transistors N1 610 and N2 620, and also includes p-type transistors P1 612 and P2 622. The transistors are paired as shown, with the sources of N1 610 and P1 612 connected, and the sources of N2 620 and P2 622 connected. The drains for N1 610 and N2 620 connect to NLoad 630, and the drains for P1 612 and P2 622 connect to PLoad 632. Certain embodiments of linear transconductance elements such as CSLTE 600 may not require a current source.

The sources are connected as shown by Bridge 170. In this example, Bridge 170 is contained on the chip upon which CLSTE 600 is fabricated. Bridge 170 includes two capacitors, Capacitor 174 and Capacitor 176; in this example, Bridge 170 does not include an inductor or other impedance circuit. As with capacitors in general, Capacitor 174 and Capacitor 176 function as high pass filters.

In this example, DC bias to the transistor gates is provided by bias circuits. Input voltages from these bias circuits are received at BiasN1 640, BiasN2 650, BiasP1 642 and BiasP2 652, which provide DC bias the gates of transistors N1 610, N2 620, P1 612 and P2 622, respectively.

The bias inputs are connected to the input signals as shown. In+ 130 connects to BiasN1 640 via capacitor N1Cap 670. In+ 130 connects to BiasP1 642 via capacitor P1Cap 672. In− 140 connects to BiasN2 650 via capacitor N2Cap 680, and In− 140 connects to BiasP2 652 via capacitor P2Cap 682.

The outputs are connected to the drains as shown. Out− 510 is connected to the drain of N1 610, and is also connected to the drain of P1 612 via capacitor OutCap 660. Out+ 520 is connected to the drain of N2 620, and is also connected to the drain of P2 622 via capacitor OutCap 662.

NLoad 630 and PLoad 632 provide for the passage of current to/from their respective transistors from the power supply and ground, respectively. NLoad 630 and PLoad 632 are not current limiting. However, they also present high resistance to current flow relative to the resistance presented by outputs Out+ 520 and Out− 510. NLoad 630 and PLoad 632 can be resistive loads (e.g. resistors) or active loads (e.g. a part of the circuitry described in FIG. 26 below).

Capacitor 174 and Capacitor 176 can optionally be replaced with banks of several capacitors and the circuitry to switch between them in order to provide adjustable capacitance. In some embodiments, it may be advantageous to adjust the capacitance of Bridge 170 to change the center frequency of the band passed by Bridge 170.

Bridge 170 may provide an important function other than tuning to a specific band (which in this example of a broadband circuit, is not provided for). In some embodiments, the voltage at the junction between pairs of transistors in series (e.g. the voltage at the joined sources of N1 610 and P1 612, or the voltage at the joined sources of N2 620 or P2 622) is not fixed, and may fluctuate according. In some embodiments, this fluctuation may be associated with input signals, and in some cases, these fluctuations may induce a current flow in Bridge 170 from one pair of sources to the other pair of sources (in either direction). If Bridge 170 includes an impedance circuit, this current flow can be enabled only for frequencies passed by the circuit. If Bridge 170 is shorted, this current flow can be enabled for all frequencies. Thus, for frequencies passed by Capacitors 174 and 176, Bridge 170 allows current flow between the sources of N1 610/P1 612 and the sources of N2 620/P2 622 without constraining the voltage at either of these junctions. For embodiments that feature a single pair of transistors, Bridge 170 can also be connected to ground at the end opposite the end connected to the pair of transistors.

An aspect of CSLTE 600 is that A/C voltage may be converted to A/C current using both n-type and p-type transistors for both positive and negative voltage. As In+ 130 increases (and In− 140 decreases), current may be increasingly carried by the combination of N1 610 and P2 622. As In+ 130 decreases (and In− 140 increases), current may be increasingly carried by the combination of N2 620 and P1 612. Whereas many existing transconductance elements display a "kink" in the I-V response near zero input voltage, CSLTE 600 may not. As a result, the linearity of CSLTE 600 may be improved, and CSLTE 600 is thus called a "linear" common source transconductance element for the purposes of this specification.

FIGS. 7A, 7B and 7C show several options for bridge configurations. These examples are illustrative, and are not intended to be limiting. The choice of number and configuration of bridges is one of the major differences between (e.g.) LNA 100 and LNA 200.

FIG. 7A shows the bridge used for CSLTE 600, and is provided as a reference. Because Tune Block 172 has zero impedance in this example (and so functions as a simple connection between Capacitor 174 and Capacitor 176) it is not shown. An LNA incorporating this configuration of Bridge 170 would provide broadband amplification.

FIG. 7B shows two bridges, Bridge 170 and Bridge 270. Bridge 170 includes Tune Block 172, and Bridge 270 includes Tune Block 272. Bridge 170 includes Capacitor 174 and Capacitor 176 on either side of Tune Block 172, and Bridge 270 includes Capacitor 274 and Capacitor 276 on either side of Tune Block 272. In each bridge, the combination of capacitors and tune block (which has an impedance) creates a bandpass filter. Because shorting either of Tune Block 172 or Tune Block 272 (i.e. reducing the impedance of either tune block to zero) provides for broadband amplification, the incorporation of multiple bridges typically includes the incorporation of tune blocks that have appreciable impedances, i.e. are not shorted.

In some cases, it may be convenient to include an inductor as part of a tune block in order to provide impedance. It may also be convenient to place this inductor outside of the chip upon which the bridge is fabricated. In this example, Pads 120 are used to schematically show that a portion of each bridge that includes the tune block can be off chip, off package, or otherwise separate from the chip upon which the bridge is fabricated. Thus, either or both of Tune Blocks 172 and 272 can be off chip if so desired. Alternately, Tune Block 172 and/or Tune Block 272 could be fabricated on chip if so desired, and any of capacitors Capacitor 174, Capacitor 176, Capacitor 274 and Capacitor 276 could be fabricated on or off chip if so desired.

By using an appropriate impedance (e.g. via tune blocks) and, capacitance (via capacitors), Bridge 270 can be designed to pass a different frequency band than the band passed by Bridge 170. Because these bridges are connected in parallel to the sources of the respective transistors, either may allow for current passage as previously described. Thus, a transconductance device (such as CSLTE 600) that incorporates multiple bridges can be tuned to amplify multiple desired bands while excluding other frequencies.

Additional bridges can be added as desired, providing for additional passed bands. FIG. 7C adds an additional Bridge 370 to the previously described pair of Bridge 170 and Bridge 270. Bridge 370 includes capacitors Capacitor 374 and Capacitor 376 in series with Tune Block 372. By choosing the capacitance of Capacitor 374 and Capacitor 376 and the impedance of Tune Block 372 appropriately, a device incorporating Bridge 170, Bridge 270 and Bridge 370 as shown can amplify three discrete bands. If further bands are desired, additional bridges can be similarly added. These tuning techniques can be applied to transconductance elements other than CSLTE 600.

Figure 8:
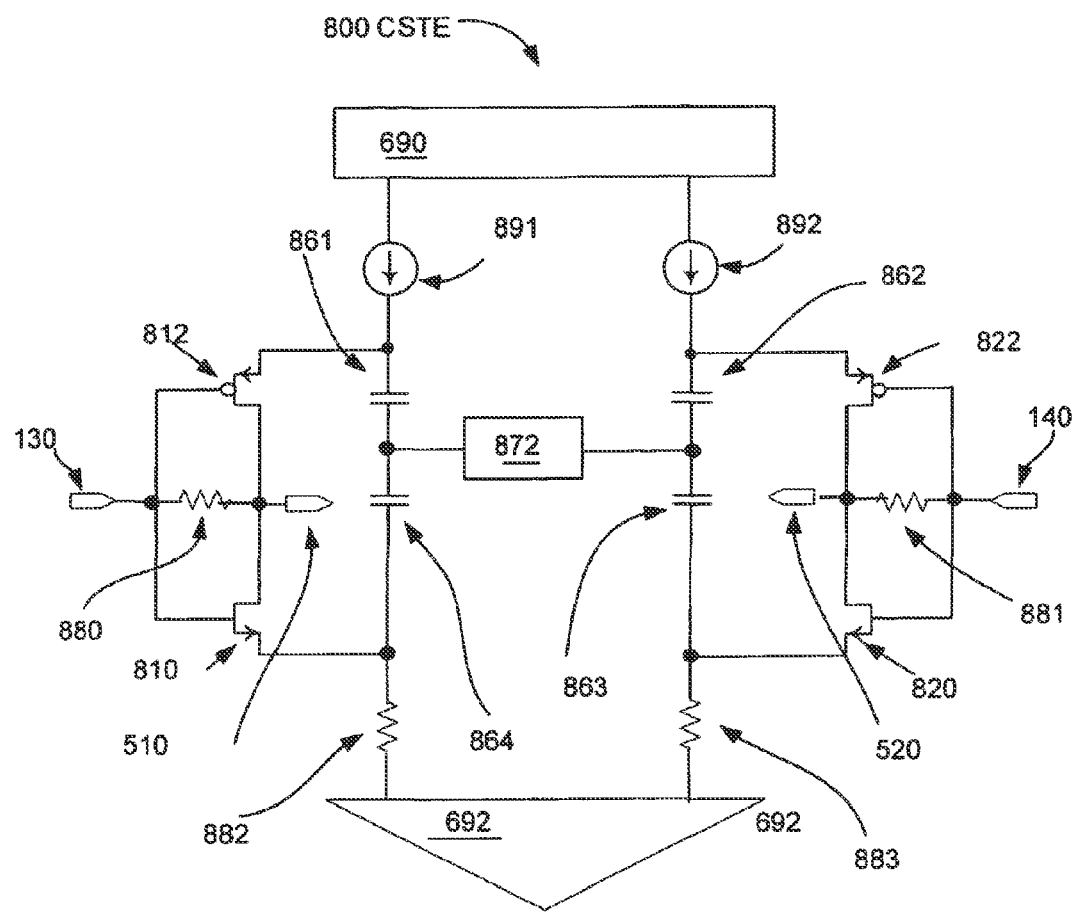
FIG. 8 is another exemplary first gain stage, showing a common source transconductance element according to one embodiment of the invention.

FIG. 8 shows another common source transconductance element CSTE 800. CSTE 800 is powered by Power Supply 690 and grounded by Ground 692. Current to one side of the circuit is supplied by ISource 891, and current to the other side of the circuit is supplied by ISource 892. The circuit includes Capacitor 861, Capacitor 862, Capacitor 863 and Capacitor 864, connected by Tune Block 872 as shown. Tune Block 872 can have an impedance (for tuned amplification) or can be shorted.

The input signal at In− 140 is copied to the gates of both p-type transistor P2 822 and n-type transistor N2 820. The input signal at In− 140 is also transmitted through Resistor 881 to connect as shown to Out+ 520. This connection also connects the drains of P2 822 and N2 820 to Out+ 520 and Resistor 881 as shown. The source of N2 820 connects to Capacitor 863 to Resistor 883. Resistor 883 connects to Ground 692 as shown. The source of P2 822 connects to ISource 892 and Capacitor 862 as shown.

Similarly, the input signal at In +130 is copied to the gates of transistors P1 812 and N1810. The input signal at In+ 130 is also transmitted through Resistor 880 to connect as shown to Out− 510. This connection also connects the drains of P1 812 and N1 810 to Out− 510 and Resistor 880 as shown. The source of N1 810 connects to Capacitor 864 and Resistor 882. Resistor 882 also connects to Ground 692 as shown. The source of P1 812 connects to the wire connecting ISource 891 to Capacitor 861 as shown.

CSTE 800 can be used as either a differential transconductance element or a single ended transconductance element. For use with a single ended input, the other input may be grounded.

Figure 9:
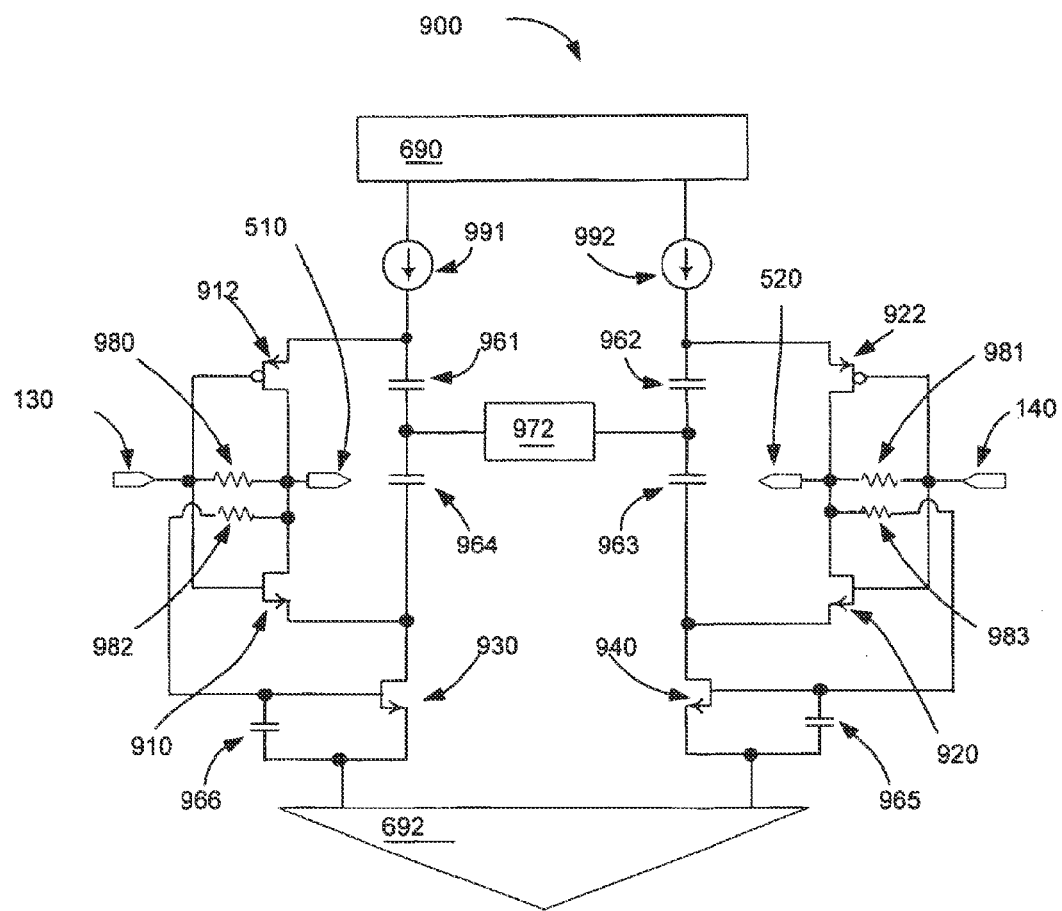
FIG. 9 is yet another exemplary first gain stage, showing a common source transconductance element according to one embodiment of the invention.

FIG. 9 shows another embodiment of a common source transconductance element, CSTE 900. Like CSTE 800, CSTE 900 may feature good supply rejection and ground rejection, but CSTE 900 may provide additional headroom. CSTE 900 is powered by Power Supply 690 and grounds to Ground 692. Current to one side of the circuit is supplied by ISource 991, and current to the other side of the circuit is supplied by ISource 992. The circuit includes Capacitor 961, Capacitor 962, Capacitor 963 and Capacitor 964, connected to Tune Block 972 as shown. Tune Block 972 can have an impedance (for tuned amplification) or can be shorted.

The input signal at In+ 130 is fed to the gates of transistors P1 912 and N1 910. The input signal at In+ 130 is also transmitted through Resistor 980 to connect to Out− 510. The signal at Out− 510 also connects the drains of P1 912 and N1 910 to Out− 510 and Resistor 980. The source of N1 910 connects to the wire connecting Capacitor 964 to the drain of transistor N3 930. Resistor 982 connects the drains of P1 912 and N1 910 to both Capacitor 966 and the gate of transistor N3 930. The source of N3 930 connects to both Ground 692 and the end of Capacitor 966 opposite the end connected to the gate of N3 930 as shown. The source of P1 912 connects to the wire connecting ISource 991 to Capacitor 961 as shown.

The input signal at In− 140 is fed to the gates of transistors P2 922 and N2 920. The input signal at In− 140 is also transmitted through Resistor 981 to Out+ 520. This connection also connects the drains of P2 922 and N2 920 to Out+ 520 and Resistor 981. The source of N2 920 connects to the wire connecting Capacitor 963 to the drain of transistor N4 940. Resistor 983 connects the drains of P2 922 and N2 920 to both Capacitor 965 and the gate of transistor N4 940. The source of N4 940 connects to both Ground 692 and the end of Capacitor 965 opposite the end connected to the gate of N4 940 as shown. The source of P2 922 connects to the wire connecting ISource 992 to Capacitor 962.

Figure 10:
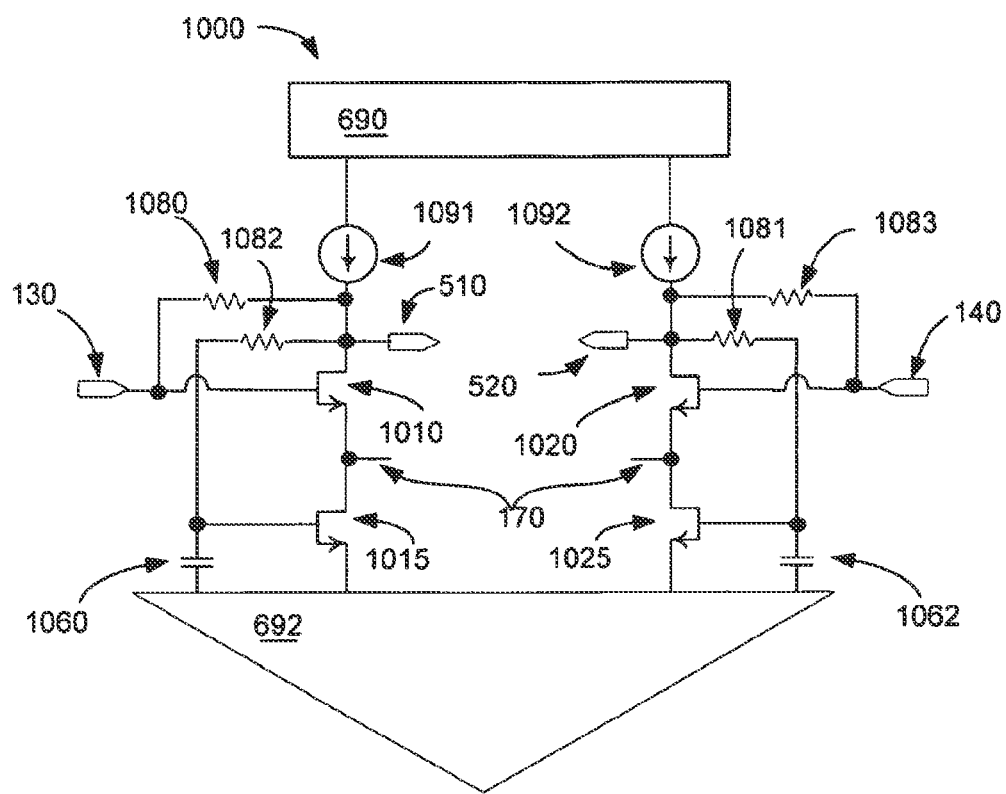
FIG. 10 is still another exemplary first gain stage, showing a common source transconductance element according to one embodiment of the invention.

FIG. 10 shows yet another example of a common source transconductance element. In some embodiments, this version may have even better headroom than the element shown in FIG. 9. CSTE 1000 is powered by Power Supply 690 and grounds to Ground 692. Current to one side of the circuit is supplied by ISource 1091, and current to the other side of the circuit is supplied by ISource 1092. The connections to Bridge 170 are shown, but the components of Bridge 170 are omitted for clarity.

In this embodiment, CSTE 1000 has only n-type transistors. In+ 130 receives an input signal, and is connected to the gate of transistor N1 1010. In+ 130 is also connected to resistor 1080, which connects In+ 130 to the wire connecting ISource 1091 to the drain of N1 1010. The drain of N1 1010 is also connected to output Out− 510 and one side of Resistor 1082. The other side of Resistor 1082 connects to Capacitor 1060, which then connects to Ground 692. The source of N1 1010 is connected to the drain of transistor N2 1015. One leg of Bridge 170 connects at this junction between the source of N1 1010 and drain of N2 1015. The source of N2 1015 connects to Ground 692, and the gate of N2 1015 is connected to the wire connecting Resistor 1082 to Capacitor 1060.

In− 140 receives an input signal, and is connected to the gate of transistor N3 1020. Also connected to In− 140 is Resistor 1083, which connects In− 140 to the wire connecting ISource 1092 to the drain of N3 1020. The drain of N3 1020 is also connected to output Out+ 520 and one side of Resistor 1081. The other side of Resistor 1081 connects to Capacitor 1062, which then connects to Ground 692. The source of N3 1020 is connected to the drain of transistor N4 1025. The other leg of Bridge 170 connects at this junction between the source of N3 1020 and drain of N4 1025. The source of N4 1025 connects to Ground 692, and the gate of N4 1025 is connected to the wire connecting Resistor 1081 to Capacitor 1062. CSTE 1000 may be used with a single ended input by grounding the other input.

The following several figures show different embodiments of bias circuits for creating a DC gate bias for one or more transistors. An exemplary transconductance element that requires a bias circuit is CSLTE 600. Thus, the bias circuits in the following figures provide the bias inputs into other circuits (e.g. CSLTE 600).

Figure 11:
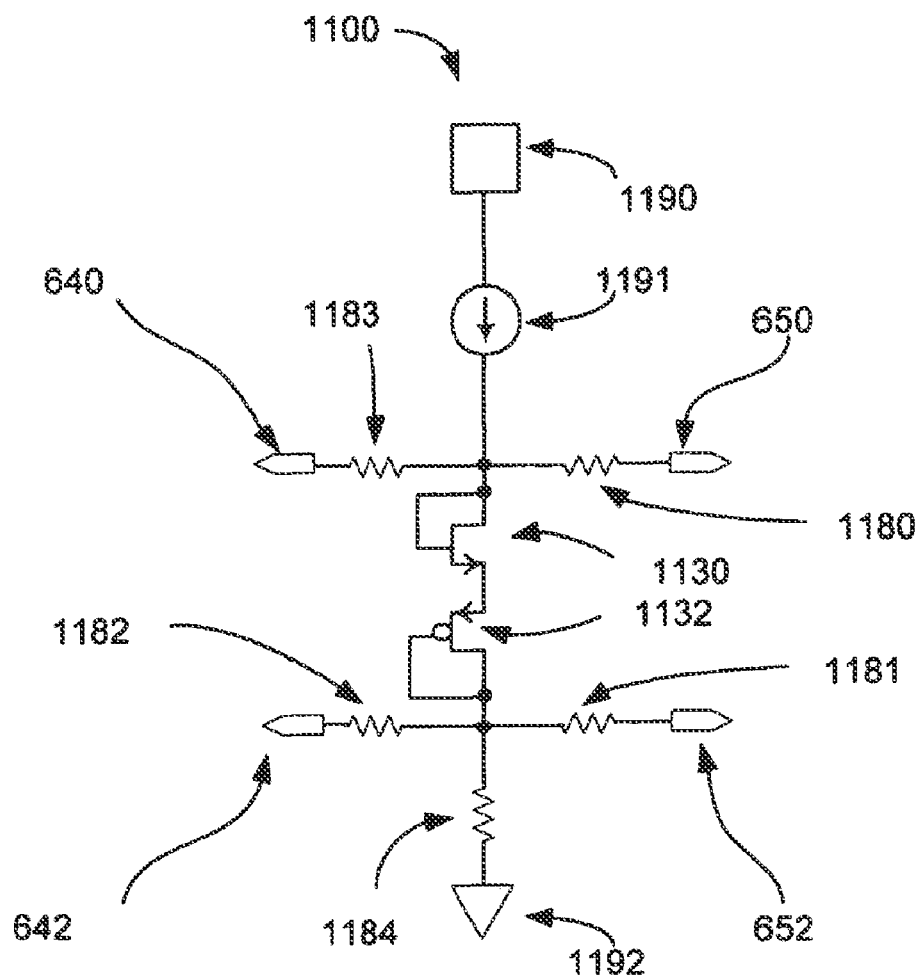
FIG. 11 is a schematic of an exemplary bias circuit according to one embodiment of the invention.

FIG. 11 is a schematic diagram of exemplary Bias Circuit 1100. Bias Circuit 1100 is powered by Power Supply 1190 and is grounded by Ground 1192. Bias voltage from Bias Circuit 1100 is output to the respective transistors whose gates are being biased by Bias Circuit 1100 at outputs BiasN1 640, BiasN2 650, BiasP1 642 and BiasP2 652. Current is sourced by ISource 1191, which connects to Power Supply 1190.

Bias Circuit 1100 includes two transistors, n-type transistor N3 1130 and p-type transistor P3 1132. N3 1130 and P3 1132 are connected at their sources as shown. The gate of N3 1130 is connected to the drain of N3 1130, and the gate of P3 1132 is connected to the drain of P3 1132. The drain of N3 1130 is connected to Isource 1191, and is also connected to Resistor 1183 and Resistor 1180. Resistor 1183 connects the drain of N3 1130 to BiasN1 640, and Resistor 1180 connects the drain of N3 1130 to BiasN2 650. The drain of P3 1132 is connected to Resistor 1184, whose other end connects to Ground 1192 as shown. The drain of P3 1132 is also connected to Resistor 1182 and Resistor 1181. Resistor 1182 connects the drain of P3 1132 to BiasP1 642, and Resistor 1181 connects the drain of P3 1132 to BiasP2 652.

Figure 12:
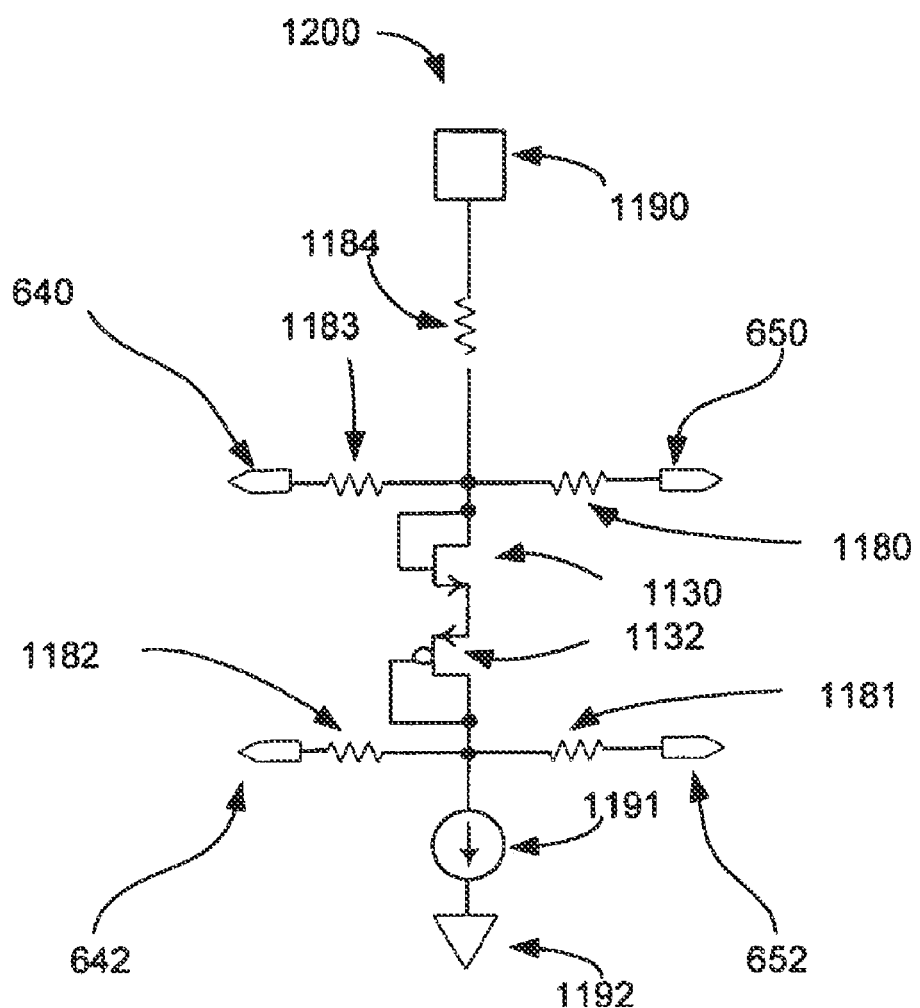
FIG. 12 is a schematic of an exemplary bias circuit according to one embodiment of the invention.

FIG. 12 is a schematic of Bias Circuit 1200, which includes the same components as Bias Circuit 1100, in a similar configuration, but with the positions of current source ISource 1191 and Resistor 1184 reversed. Thus, Resistor 1184 connects Power Supply 1190 to the rest of the circuit, and the circuit is connected to Ground 1192 via current source ISource 1191.

Figure 13:
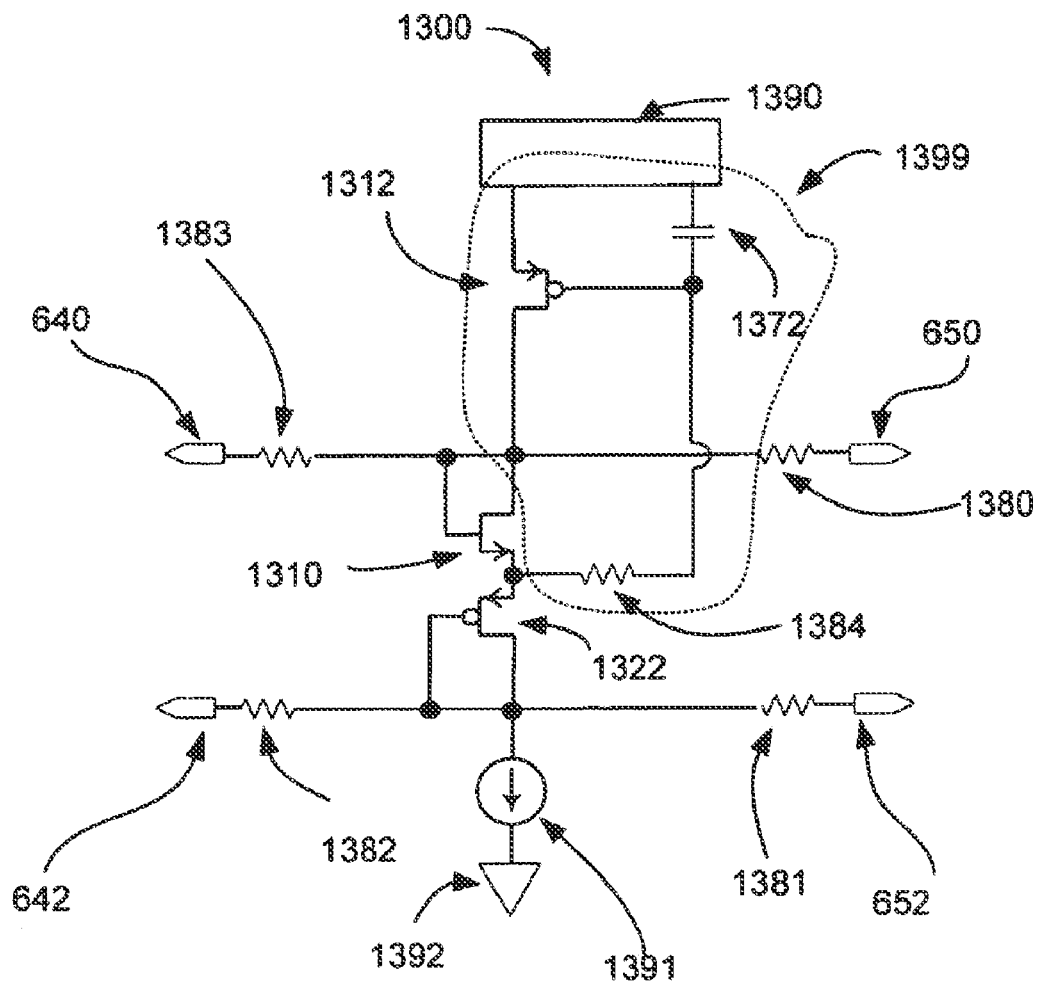
FIG. 13 is a schematic of an exemplary bias circuit according to one embodiment of the invention.

FIG. 13 is a schematic of exemplary Bias Circuit 1300, which is powered by Power Supply 1390 and is grounded by Ground 1392. Bias voltage from Bias Circuit 1300 is output to the respective transistors whose gates are being biased by Bias Circuit 1300 at outputs BiasN1 640, BiasN2 650, BiasP1 642 and BiasP2 652. Current is sourced from ISource 1391, which connects to Ground 1392. Power Supply 1390 connects to both one side of Capacitor 1372 and the source of p-type transistor P1 1312. The gate of P1 1312 connects to the other side of Capacitor 1372. This junction between Capacitor 1372 and the wire to the gate of P1 1312 is also connected to Resistor 1384, which then connects to the sources of transistors N1 1310 (n-type) and P2 1322 (p-type); these sources are connected to each other.

The drain of P1 1312 connects to the drain of N1 1310. The drain and gate of N1 1310 are also connected. The drain of N1 1310 connects to Resistor 1383, which then connects to output BiasN1 640. The drain of N1 1310 also connects to Resistor 1380, which then connects to output BiasN2 650.

The drain and gate of P2 1322 are connected. The drain of P2 1322 also connects to ISource 1391, which then connects to Ground 1392. The drain of P2 1322 is also connected to Resistor 1382, which then connects to output BiasP1 642. The drain of P2 1322 is also connected to Resistor 1381, which then connects to output BiasP2 652.

FIG. 13 also shows an embodiment of a wrapping circuit. Wrapping Circuit 1399 comprises transistor P1 1312, Capacitor 1372 and Resistor 1384. Other embodiments may be constructed with n-type transistors also. This embodiment of Wrapping Circuit 1399 has two points of connection that connect (i.e. "wrap") around a device being wrapped. A wrapping circuit connects to an electronic device on two sides (i.e. at two connections to the device), and typically makes a connection from the device to either a ground or a power supply. A wrapping circuit may create a high impedance connection between the device (being wrapped) and a ground, power supply or similar component. A wrapping circuit may also protect the device (being wrapped) from ground noise and/or supply noise. Wrapping circuits can be used in a wide variety of circuits, and examples are shown in FIGS. 9, 10, 14, 18 and 19 (although the wrapping circuits are not independently defined so as to improve clarity of these illustrations). In FIG. 13, Wrapping Circuit 1399 wraps N1 1310, by connecting to both the drain of N1 1310 and the gate of N1 1310.

Figure 14:
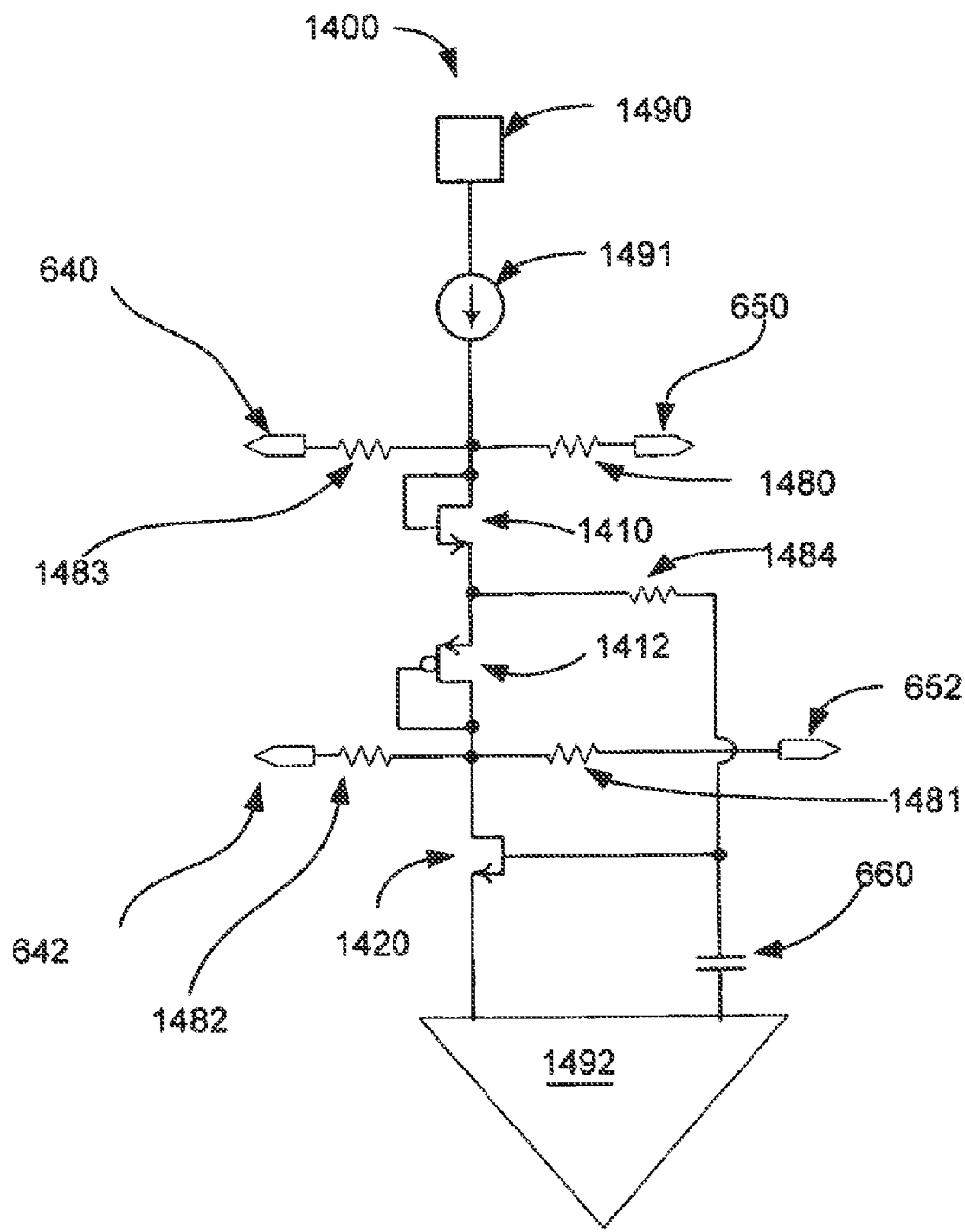
FIG. 14 is a schematic of an exemplary bias circuit according to one embodiment of the invention.

FIG. 14 is a schematic diagram of another exemplary Bias Circuit 1400, which is powered by Power Supply 1490 and is grounded by Ground 1492. Bias voltage from Bias Circuit 1400 is output to the respective transistors whose gates are being biased by Bias Circuit 1400 at outputs BiasN1 640, BiasN2 650, BiasP1 642 and BiasP2 652. Current is sourced from ISource 1491, which connects to Power Supply 1490.

ISource 1491 also connects to the drain and gate of n-type transistor N1 1410. The drain of N1 1410 also connects to Resistor 1483, which then connects to output BiasN1 640. The drain of N1 1410 also connects to Resistor 1480, which then connects to BiasN2 650. The source of N1 1410 is connected to the source of p-type transistor P1 1412. Both of these sources are connected to Resistor 1484, which then connects to Capacitor 660, which then connects to Ground 1492. The gate and drain of P1 1412 are connected. The drain of P1 1412 also connects to Resistor 1482, which then connects to output BiasP1 642. The drain of P1 1412 also connects to Resistor 1481, which then connects to output BiasP2 652. The drain of P1 1412 also connects to the drain of n-type transistor N2 1420. The source of N2 1420 connects to Ground 1492. The gate of N2 1420 is connected to the junction between Resistor 1484 and Capacitor 660.

Bias circuit 1400 also includes a wrapping circuit, comprised of N2 1420, Capacitor 660 and Resistor 1481, wrapping around P1 1412.

Figure 15:
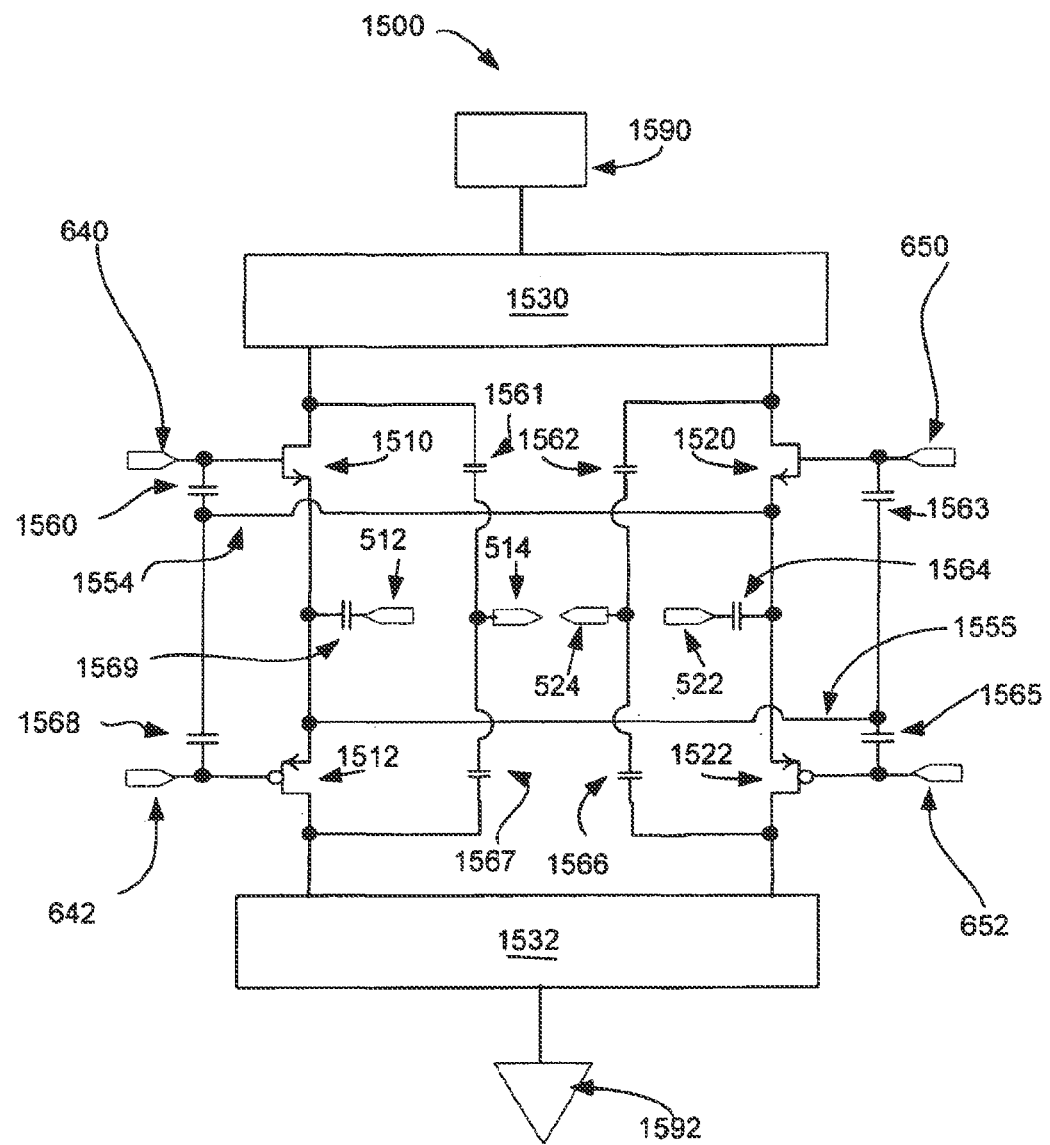
FIG. 15 is a schematic of an exemplary second gain stage, showing a common gate linear transconductance element that features a cross coupling circuit according to one embodiment of the invention.

FIG. 15 is an exemplary common gate transconductance element, appropriate for use in Gm2 302. Gm2 1500 is a cross coupled, common gate, linear transconductance element. Gm2 1500 is powered by Power Supply 1590 via NLoad 1530 and is grounded via PLoad 1532 to Ground 1592. In some embodiments, cross coupling can provide for noise cancellation. In other embodiments, cross coupling can provide for the conversion of a single ended input into a differential output.

Gm2 1500 receives inputs In− 512 and In+ 522, and outputs Out− 514 and Out+ 524. Gm2 1500 includes four transistors: n-type transistors N1 1510 and N2 1520, and p-type transistors P1 1512 and P2 1522.

The drain of N1 1510 is connected to NLoad 1530. The drain of N1 1510 is also connected to Capacitor 1561, which then connects to Out− 514. The drain of P1 1512 is connected to PLoad 1532. The drain of P1 1512 is also connected to Capacitor 1567, which then connects to Out− 514. Thus, the drains of N1 1510 and P1 1512 are connected by Capacitor 1561 and Capacitor 1567 in series.

The gate of N1 1510 is biased by input from BiasN1 640. The gate of P1 1512 is biased by input from BiasP1 642. These two inputs (and the gates of N1 1510 and P1 1512) are connected by Capacitor 1560 and Capacitor 1568 in series. Capacitors 1560 and 1568 are connected to the sources of N2 1520 and P2 1522 by Coupling 1554.

The sources of N1 1510 and P1 1512 are connected. These sources are also connected to Capacitor 1569, which then connects to In− 512.

The drain of N2 1520 is connected to NLoad 1530. The drain of N2 1520 is also connected to Capacitor 1562, which then connects to Out+ 524. The drain of P2 1522 is connected to PLoad 1532. The drain of P2 1522 is also connected to Capacitor 1566, which then connects to Out+ 524. Thus, the drains of N2 1520 and P2 1522 are connected by Capacitor 1562 and Capacitor 1566 in series.

The gate of N2 1520 is biased by input from BiasN2 650. The gate of P2 1522 is biased by input from BiasP2 652. These two inputs (and the gates of N2 1520 and P2 1522) are connected by Capacitor 1563 and Capacitor 1565 in series. Capacitors 1563 and 1565 are connected to the sources of N1 1510 and P1 1512 by Coupling 1555.

In this example, Coupling 1554 connects the side of Capacitor 1560 opposite the gate of N1 1510 to the sources of N2 1520 and P2 1522. Similarly, Coupling 1555 connects the side of Capacitor 1565 opposite the gate of P2 1522 to the sources of N1 1510 and P1 1512. The combination of Coupling 1554 and Capacitors 1560 and 1568 creates an exemplary coupling circuit. The combination of Capacitors 1565 and 1563 with Coupling 1555 also creates an exemplary coupling circuit. The combination of these two coupling circuits creates a cross coupling, and so Gm2 1500 is an example of a cross coupled transconductance element. A key feature of this embodiment is that the gates on one side of the circuit are connected to the sources on the opposite side of the circuit. This cross coupled transconductance element has several features. When operated in a differential mode (i.e. receiving differential input), the cross coupling can provide noise cancellation, and in some cases can convert differential or gate noise at the inputs to common mode noise at the outputs. In cases where Gm2 1500 is being adapted for use with single ended input, the cross coupling circuit can provide for the conversion of single ended input into differential output. In some aspects, the cross coupling converts single ended input to differential output can be thought of as the formation of two circuits: a common gate transconductance element that converts current to voltage with positive polarity, and a common source voltage to voltage converter with negative polarity, with both circuits having similar gain. Thus, cross coupled transconductance elements such as Gm2 1500 can function as single ended to differential converters.

The sources of N2 1520 and P2 1522 are connected. These sources are also connected to Capacitor 1564, which then connects to In+ 522.

NLoad 1530 and PLoad 1532 provide for the passage of current, and are not current limiting. They also present high resistance to current flow relative to the resistance presented by outputs Out+ 520 and Out− 510. NLoad 1530 and PLoad 1532 can be resistive loads or active loads.

Figure 16:
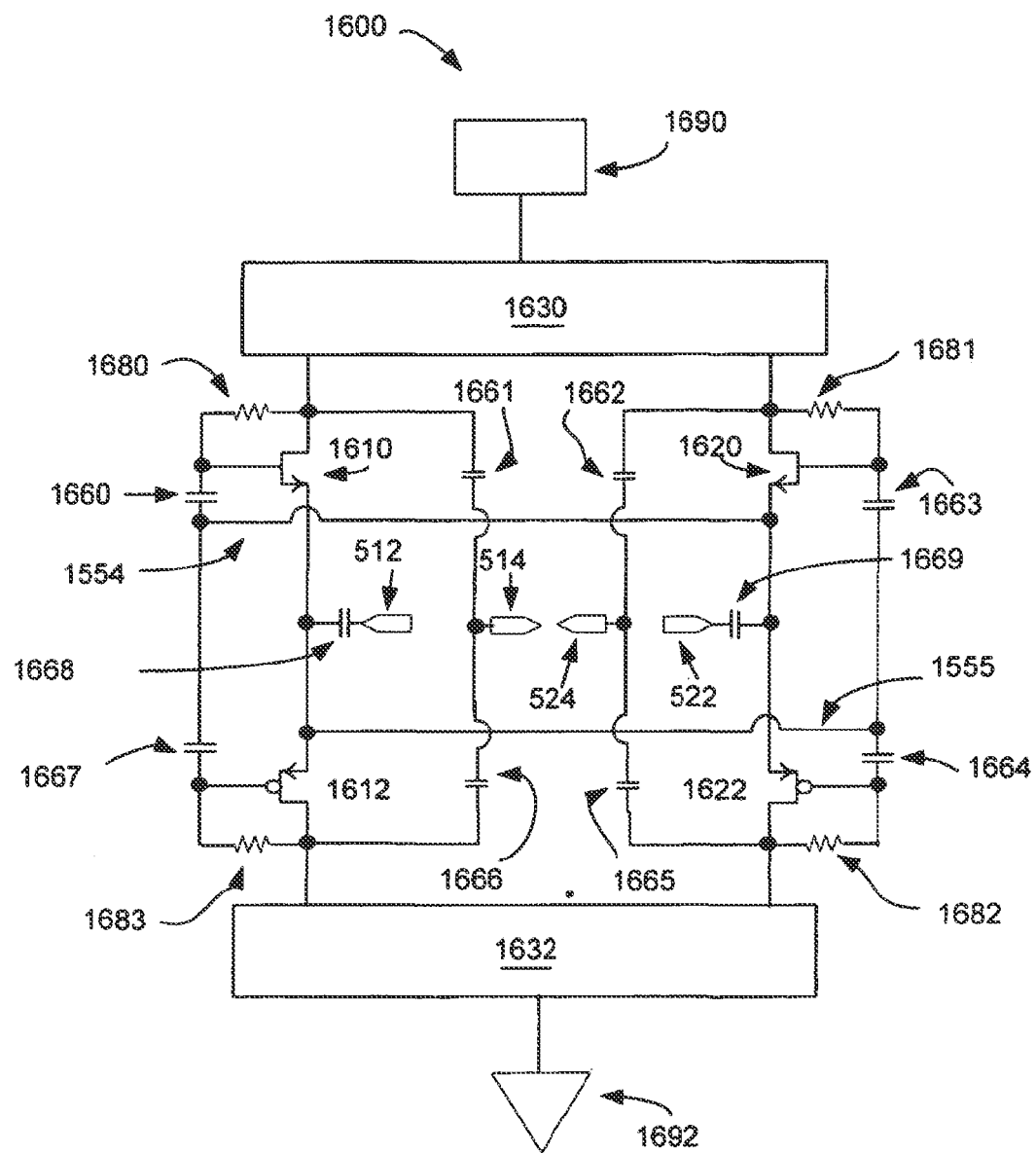
FIG. 16 is a schematic of another exemplary second gain stage, showing a common gate linear transconductance element that features a cross coupling circuit according to one embodiment of the invention.

FIG. 16 is an exemplary common gate transconductance element, appropriate for use in Gm2 302. Gm2 1600 is a cross coupled, common gate linear transconductance element that is self biasing. Gm2 1600 is powered by Power Supply 1690 via NLoad 1630 and is grounded via PLoad 1632 to Ground 1692. Gm2 1600 features cross coupling as did Gm2 1500.

Gm2 1600 receives inputs In− 512 and In+ 522, and outputs Out− 514 and Out+ 524. Gm2 1600 includes four transistors: n-type transistors N1 1610 and N2 1620, and p-type transistors P1 1612 and P2 1622.

NLoad 1630 is connected to the drain of N1 1610. The drain of N1 1610 is also connected to Capacitor 1661, which then connects to output Out-514. The drain of N1 1610 is connected to the gate of N1 1610 through resistor 1680. The gate of N1 1610 is also connected to Capacitor 1660, which then connects to the sources of N2 1620 and P2 1622. The sources of N1 1610 and P1 1612 are connected. Capacitor 1668 also connects to these sources, and the side of Capacitor 1668 opposite the sources is connected to In− 512.

PLoad 1632 is connected to the drain of P1 1612. The drain of P1 1612 is also connected to Capacitor 1666, which then connects to output Out− 514. The drain of P1 1612 is connected to the gate of P1 1612 through Resistor 1683. The gate of P1 1612 is also connected to Capacitor 1667, which then connects to the sources of N2 1620 and P2 1622.

The side of Capacitor 1660 opposite Resistor 1680 also connects to the side of Capacitor 1667 opposite Resistor 1683.

NLoad 1630 is connected to the drain of N2 1620. The drain of N2 1620 is also connected to Capacitor 1662, which then connects to output Out+ 524. The drain of N2 1620 is connected to the gate of N2 1620 through resistor 1681. The gate of N2 1620 is also connected to Capacitor 1663, which then connects to the sources of N1 1610 and P1 1612. The sources of N2 1620 and P2 1622 are connected. Capacitor 1669 also connects to these sources, and the side of Capacitor 1669 opposite the sources is connected to In+ 522.

PLoad 1632 is connected to the drain of P2 1622. The drain of P2 1622 is also connected to Capacitor 1665, which then connects to output Out+ 524. The drain of P2 1622 is connected to the gate of P2 1622 through Resistor 1682. The gate of P2 1622 is also connected to Capacitor 1664, which then connects to the sources of N1 1610 and P1 1612.

The side of Capacitor 1663 opposite Resistor 1681 also connects to the side of Capacitor 1664 opposite Resistor 1682.

In this example, Coupling 1554 connects the side of Capacitor 1660 opposite the gate of N1 1610 to the sources of N2 1620 and P2 1622. Similarly, Coupling 1555 connects the side of Capacitor 1664 opposite the gate of P2 1622 to the sources of N1 1610 and P1 1612. The combination of Coupling 1554 and Capacitors 1660 and 1667 creates an exemplary coupling circuit. The combination of Capacitors 1663 and 1664 with Coupling 1555 also creates an exemplary coupling circuit. The combination of these two coupling circuits creates a cross coupling, and so Gm2 1600 is an example of a cross coupled transconductance element. A key feature of this embodiment is that the gates on one side of the circuit are connected to the sources on the opposite side of the circuit.

Figure 17:
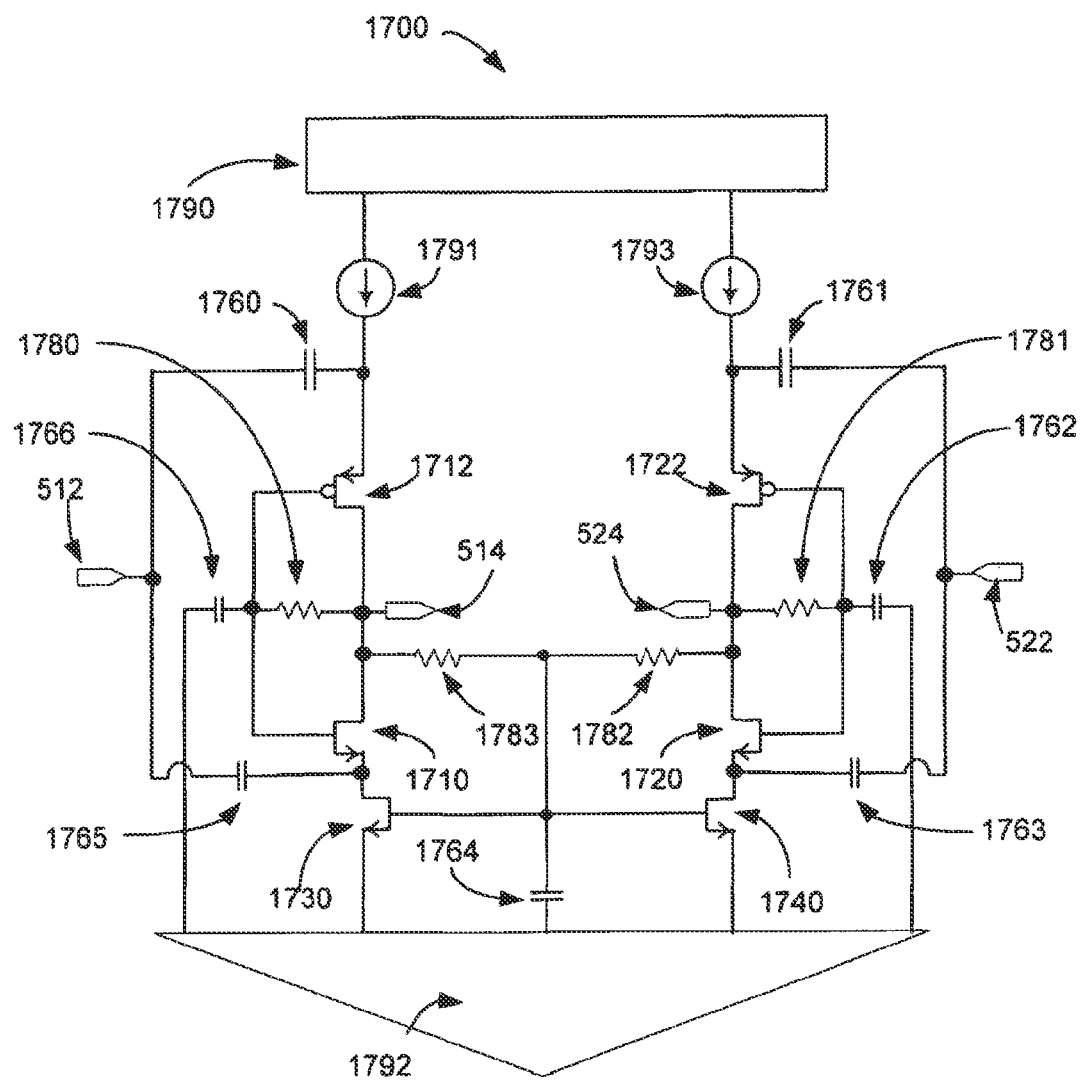
FIG. 17 is a schematic of yet another exemplary second gain stage, showing a common gate transconductance element according to one embodiment of the invention.

FIG. 17 is another exemplary common gate transconductance element, appropriate for use in Gm2 302. Gm2 1700 is a common gate transconductance element.

Gm2 1700 is powered by Power Supply 1790 and grounds to Ground 1792. Current is supplied by current sources ISource 1791 and ISource 1793. Gm2 1700 receives inputs In− 512 and In+ 522, and outputs Out− 514 and Out+ 524. Gm2 1700 includes six transistors: n-type transistors N1 1710, N2 1720, N3 1730, and N4 1740, along with p-type transistors P1 1712 and P2 1722.

ISource 1791 connects to the source of P1 1712. The source of P1 1712 is also connected to Capacitor 1760, which then connects to In− 512. In− 512 also connects to Capacitor 1765, which then connects to the source of N1 1710 and drain of N3 1730. The drain of P1 1712 connects to the drain of N1 1710. These drains are also connected to Out− 514. These drains and Out-514 are also connected to Resistor 1780, which then connects to Capacitor 1766. The connection between Resistor 1780 and Capacitor 1766 is also connected to the gate of P1 1712 and the gate of N1 1710, hence these gates are connected. The side of Capacitor 1766 opposite the gate connections is connected to Ground 1792.

The source of N1 1710 is connected to the drain of N3 1730. The source of N3 1730 is connected to Ground 1792. The gate of N3 1730 is connected to the gate of N4 1740. These gates are also connected to Capacitor 1764, which then connects to Ground 1792.

The drains of P1 1712 and N1 1710 are connected to Resistor 1783, which then connects to Resistor 1782. Resistor 1782 then connects to the drains of P2 1722 and N2 1720.

ISource 1793 connects to the source of P2 1722. The source of P2 1722 is also connected to Capacitor 1761, which then connects to In+ 522. In+ 522 also connects to Capacitor 1763, which then connects to the source of N2 1720 and drain of N4 1740. The drain of P2 1722 connects to the drain of N2 1720. These drains are also connected to Out+ 524. These drains and Out+ 524 are also connected to Resistor 1781, which then connects to Capacitor 1762. The connection between Resistor 1781 and Capacitor 1762 is also connected to the gate of P2 1722 and the gate of N2 1720, hence these gates are connected. The side of Capacitor 1762 opposite the gate connections is connected to Ground 1792.

The source of N2 1720 is connected to the drain of N4 1740. The source of N4 1740 is connected to Ground 1792. The gate of N4 1740 is connected to the gate of N3 1730. These gates are also connected to Capacitor 1764, which then connects to Ground 1792.

The drains of P2 1722 and N2 1720 are connected to Resistor 1782, which then connects to Resistor 1783. Resistor 1783 then connects to the drains of P1 1712 and N1 1710. The connection between Resistors 1782 and 1783 is connected to the gates of N3 1730 and N4 1740.

Figure 18:
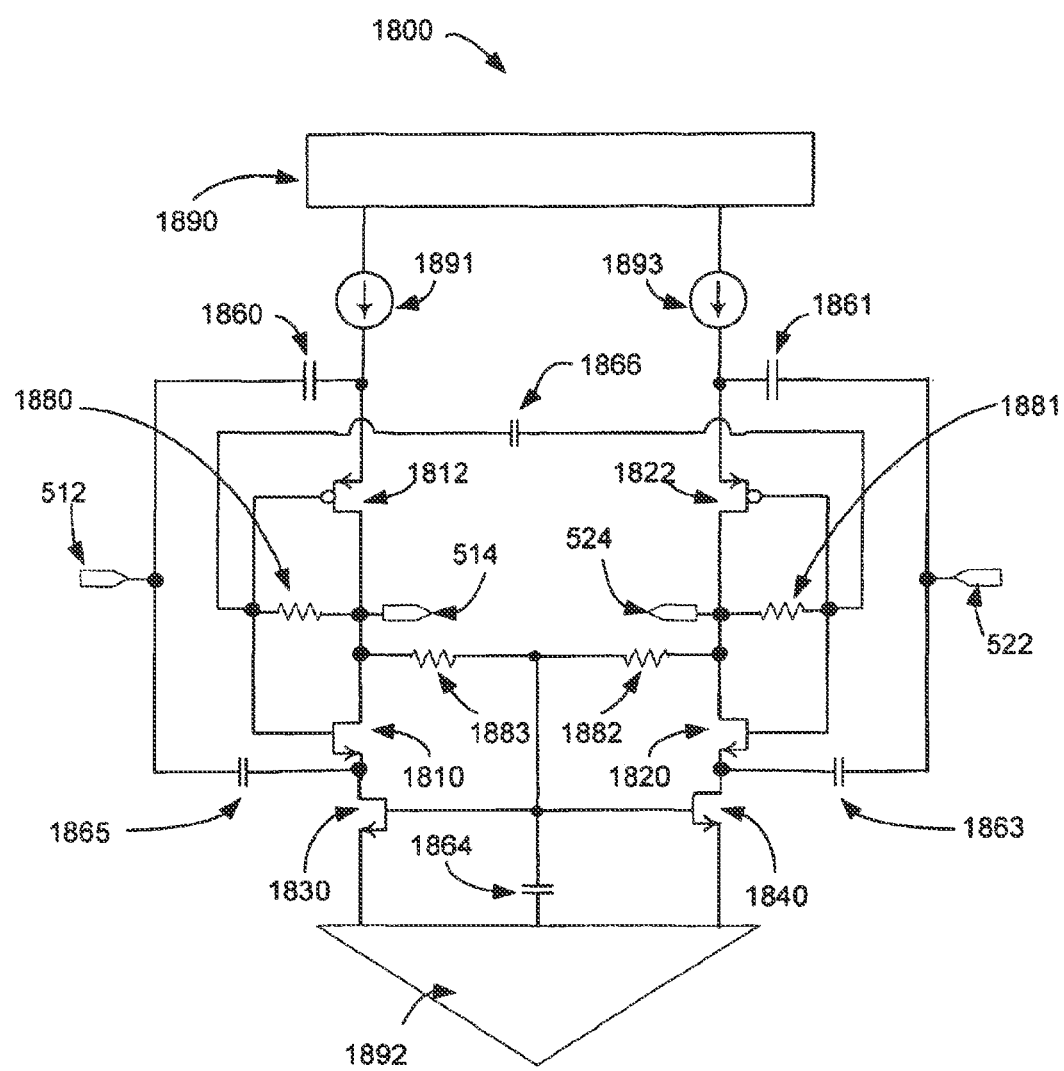
FIG. 18 is a schematic of still another exemplary second gain stage, showing a common gate transconductance element according to one embodiment of the invention.

FIG. 18 is another exemplary common gate transconductance element, appropriate for use in Gm2 302. Gm2 1800 is a common gate transconductance element.

Gm2 1800 is powered by Power Supply 1890 and grounds to Ground 1892. Current is supplied by current sources ISource 1891 and ISource 1893. Gm2 1800 receives inputs In− 512 and In+ 522, and outputs Out− 514 and Out+ 524. Gm2 1800 includes six transistors: n-type transistors N11810, N2 1820, N3 1830, and N4 1840, along with p-type transistors P1 1812 and P2 1822.

ISource 1891 connects to the source of P11812. The source of P1 1812 is also connected to Capacitor 1860, which then connects to In− 512. In− 512 also connects to Capacitor 1865, which then connects to the source of N1 1810 and drain of N3 1830. The drain of P1 1812 connects to the drain of N1 1810. These drains are also connected to Out-514. These drains and Out-514 are also connected to Resistor 1880, which then connects to Capacitor 1866. The connection between Resistor 1880 and Capacitor 1866 is also connected to the gate of P1 1812 and the gate of N1 1810, hence these gates are connected. The side of Capacitor 1866 opposite the connection to Resistor 1880 connects to the gates of P2 1822 and N2 1820.

The source of N1 1810 is connected to the drain of N3 1830. The source of N3 1830 is connected to Ground 1792. The gate of N3 1830 is connected, to the gate of N4 1840. These gates are also connected to Capacitor 1864, which then connects to Ground 1792.

The drains of P1 1812 and N1 1810 are connected to Resistor 1883, which then connects to Resistor 1882. Resistor 1882 then connects to the drains of P2 1822 and N2 1820.

Source 1893 connects to the source of P2 1822. The source of P2 1822 is also connected to Capacitor 1861, which then connects to In+ 522. In+ 522 also connects to Capacitor 1863, which then connects to the source of N2 1820 and drain of N4 1840. The drain of P2 1822 connects to the drain of N2 1820. These drains are also connected to Out+ 524. These drains and Out+ 524 are also connected to Resistor 1881, which then connects to Capacitor 1866. The connection between Resistor 1881 and Capacitor 1866 is also connected to the gate of P2 1822 and the gate of N2 1820, hence these gates are connected. The side of Capacitor 1866 opposite the connection to Resistor 1881 connects to the gates of P1 1812 and N1 1810.

The source of N2 1820 is connected to the drain of N4 1840. The source of N4 1840 is connected to Ground 1892. The gate of N4 1840 is connected to the gate of N3 1830. These gates are also connected to Capacitor 1864, which then connects to Ground 1892.

The drains of P2 1822 and N2 1820 are connected to Resistor 1882, which then connects to Resistor 1883. Resistor 1883 then connects to the drains of P1 1812 and N1 1810. The connection between Resistors 1882 and 1883 is connected to the gates of N3 1830 and N4 1840.

Gm2 1800 also includes two exemplary wrapping circuits. N1 1810 is wrapped by the wrapping circuit comprising N3 1830, Capacitor 1864, and Resistor 1883. N2 1820 is wrapped by the wrapping circuit comprising N4 1840, Capacitor 1864 and Resistor 1882.

Figure 19:
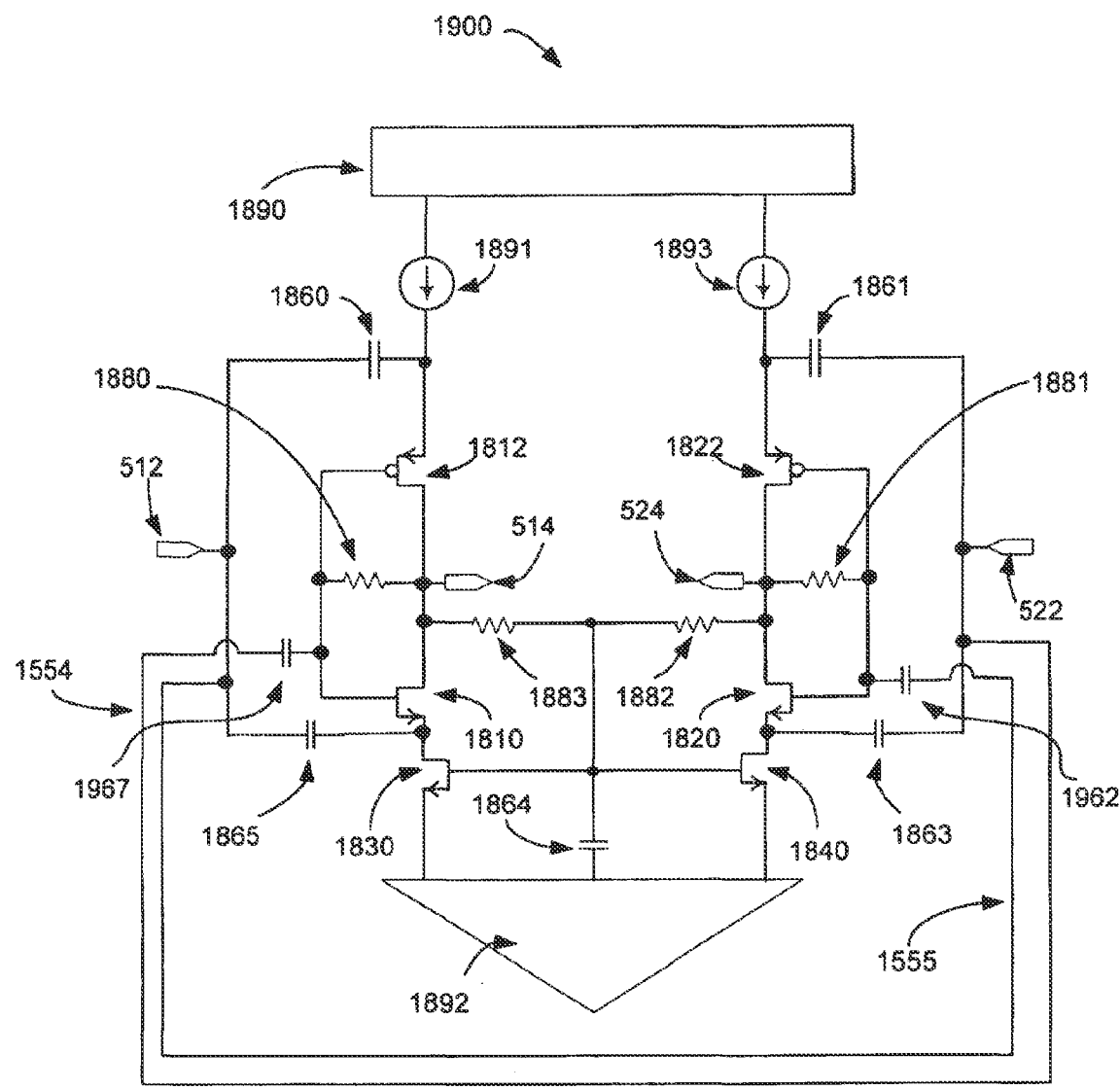
FIG. 19 is a schematic of yet another exemplary second gain stage, showing a common gate transconductance element that features a cross coupling circuit according to one embodiment of the invention.

FIG. 19 shows another exemplary common gate transconductance element, appropriate for use in Gm2 302. Gm2 1900 is a cross coupled, common gate transconductance element. Many features of Gm2 1900 are similar to those of Gm2 1800. However Gm2 1900 has two additional circuits, and Gm2 1900 does not have the circuit comprising Capacitor 1866 that is present in Gm2 1800. The gates of P1 1812 and N1 1910 are connected to Capacitor 1967, which then connects to In+ 522.

The gates of P2 1822 and N2 1820 are connected to Capacitor 1962, which then connects to In− 512. The circuits including Capacitors 1962 and 1967 substantially form a cross coupling circuit.

In this example, Coupling 1554 connects the side of Capacitor 1967 opposite the gates of N1 1810 and P1 1812 to the sources of N2 1620 and P2 1622. Similarly, Coupling 1555 connects the side of Capacitor 1664 opposite the gate of P2 1622 to the sources of N1 1610 and P1 1612. The combination of Coupling 1554 and Capacitors 1660 and 1667 creates an exemplary coupling circuit. The combination of Capacitors 1663 and 1664 with Coupling 1555 also creates an exemplary coupling circuit. The combination of these two coupling circuits creates a cross coupling, and so Gm2 1600 is an example of a cross coupled transconductance element. A key feature of this embodiment is that the gates on one side of the circuit are connected to the sources on the opposite side of the circuit.

Figure 20:
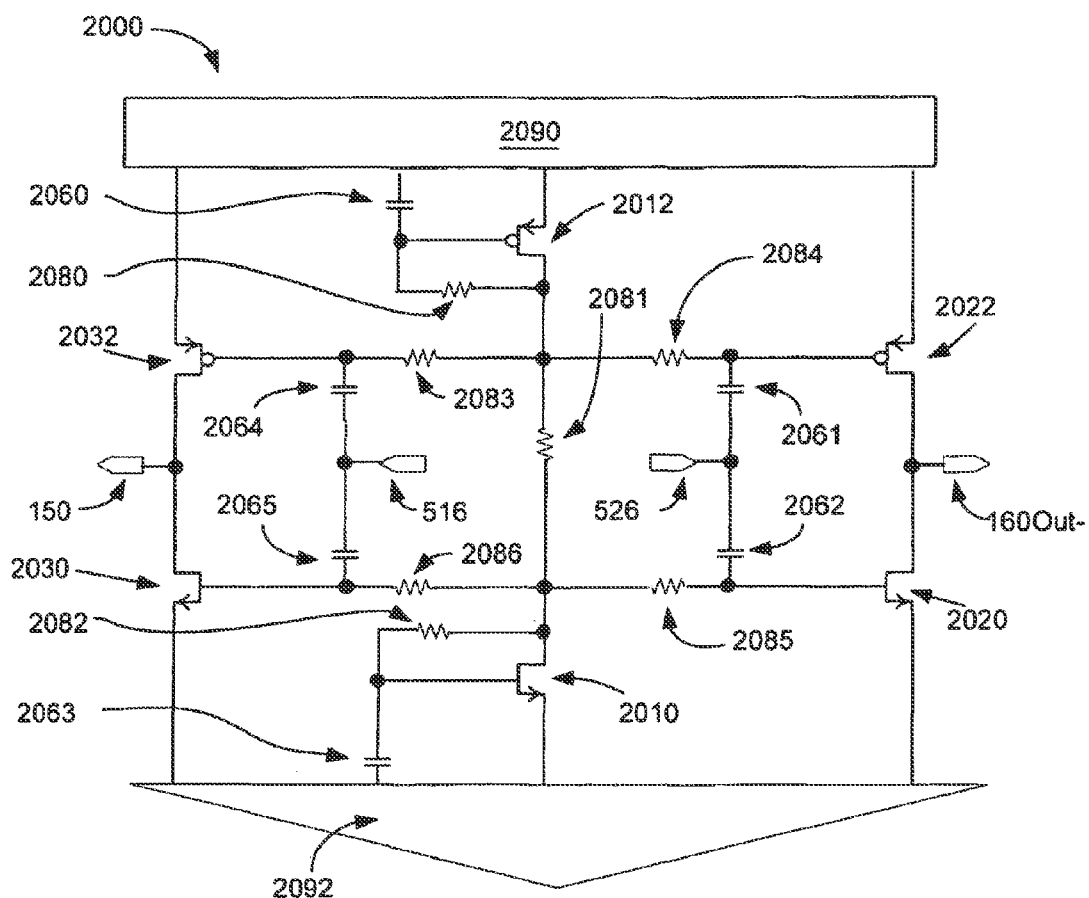
FIG. 20 is a schematic of an exemplary third gain stage, showing a push pull transconductance element according to one embodiment of the invention.

FIG. 20 is an exemplary push pull transconductance element appropriate for use in Gm3 303. Gm3 2000 is a common source, push pull transconductance element, and is powered by Power Supply 2090 and is grounded by Ground 2092. Gm3 2000 receives inputs In− 516 and In+ 526, and outputs Out+ 150 and Out− 160. The output signals are inverted with respect to the input signals. Gm3 2000 includes n-type transistors N1 2010, N2 2020 and N3 2030. Gm3 2000 also includes p-type transistors P1 2012, P2 2022 and P3 2032. In this example transconductance element, an example of a bias circuit (including P1 2012 and N1 2010) is included with other transconductance circuitry on the same diagram.

Power Supply 2090 connects to the source of P1 2012. Power Supply 2090 also connects to Capacitor 2060, which then connects to the gate of P1 2012. The gate of P1 2012 is also connected to Resistor 2080, which then connects to the drain of P1 2012. The drain of P1 2012 connects to Resistor 2081, which then connects to the drain of N1 2010.

Ground 2092 connects to the source of N1 2010. Ground 2092 also connects to Capacitor 2063, which then connects to the gate of N1 2010. The gate of N1 2010 also connects to Resistor 2082, which then connects to the drain of N1 2010.

The drain of P1 2012 is connected to the gate of P2 2022 via Resistor 2084, providing gate bias. The drain of P1 2012 is also connected to the gate of P3 2032 via Resistor 2083, providing gate bias. The drain of N1 2010 is connected to the gate of N2 2020 via resistor 2085, providing gate bias. The drain of N1 2010 is connected to the gate of N3 2030 via Resistor 2086, providing gate bias. The gate of P3 2032 is connected to Capacitor 2064, which is then connected to In− 516. The gate of P2 2022 is connected to Capacitor 2061, which then connects to In+ 526. The gate of N3 2030 is connected to Capacitor 2065, which is then connected to In− 516. The gate of N2 2020 is connected to Capacitor 2062, which is then connected to In+ 526.

The sources of P3 2032 and P2 2022 are connected to Power Supply 2090. The sources of N3 2030 and N2 2020 are connected to Ground 2092. The drain of P3 2032 is connected to the drain of N3 2030, and these drains connect to Out+ 150. The drain of P2 2022 is connected to the drain of N2 2020, and these drains connect to Out− 160.

Figure 21:
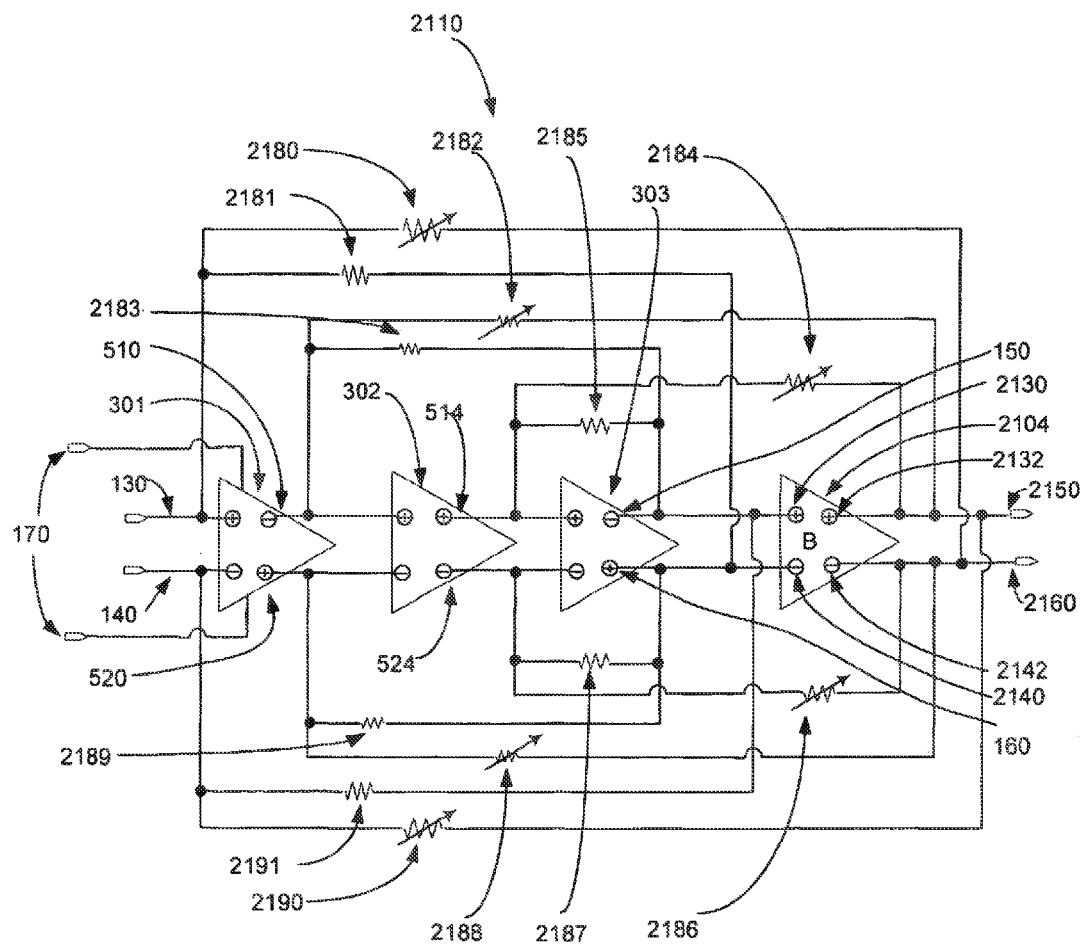
FIG. 21 is schematic of an exemplary LNA circuit that also includes a buffer stage according to one embodiment of the invention.

FIG. 21 is a schematic of an exemplary LNA Core that also includes a buffer stage and nested feedback circuits. Buffered LNA Core 2110 features a single Bridge 170, and both the broadband voltage to voltage converter and the feedback components are shown in the same figure. The first three gain stages, Gm1 301, Gm2 302 and Gm3 303 are similar to those of BBV2V 300 and LNA Core 110. However, Buffered LNA Core 2110 takes the output of Gm3 303 to an input for a buffer stage, Buffer 2104. Additionally, the feedback components of Buffered LNA Core 2110 are different from those of LNA Core 110 and BBV2V 300.

Out+ 150 of Gm3 303 is connected to In+ 2130 of the buffer stage Buffer 2104. Out− 160 of Gm3 303 is connected to In− 2140 of Buffer 2104. The outputs of Buffer 2104, Out+ 2132 and Out− 2142, are connected to the outputs of the device, Out+ 2150 and Out− 2160, respectively.

Several nested feedback circuits connect different inputs and outputs as shown. To simplify the diagram, each feedback circuit is annotated by the resistor included in this circuit. Switchable resistor Rf 2180 provides feedback between In+ 130 and Out− 2160. Resistor Rf 2181 provides feedback between In+ 130 and In− 2140 (which is connected to Out− 160). Switchable resistor Rf 2182 provides feedback between Out− 510 and Out+ 2150. Resistor Rf 2183 provides feedback between Out-510 and In+ 2130. Switchable resistor Rf 2184 provides feedback between Out− 514 and Out+ 2150. Resistor Rf 2185 provides feedback between Out− 514 and Out+ 150.

Switchable resistor Rf 2190 provides feedback between In− 140 and Out+ 2150. Resistor Rf 2191 provides feedback between In− 140 and In+ 2130. Switchable resistor Rf 2188 provides feedback between Out+ 520 and Out− 2160. Resistor 2189 provides feedback between Out+ 520 and Out− 160. Switchable resistor Rf 2186 provides feedback between Out+ 524 and Out− 2160. Resistor 2187 provides feedback between Out+ 524 and Out− 160.

Figure 22:
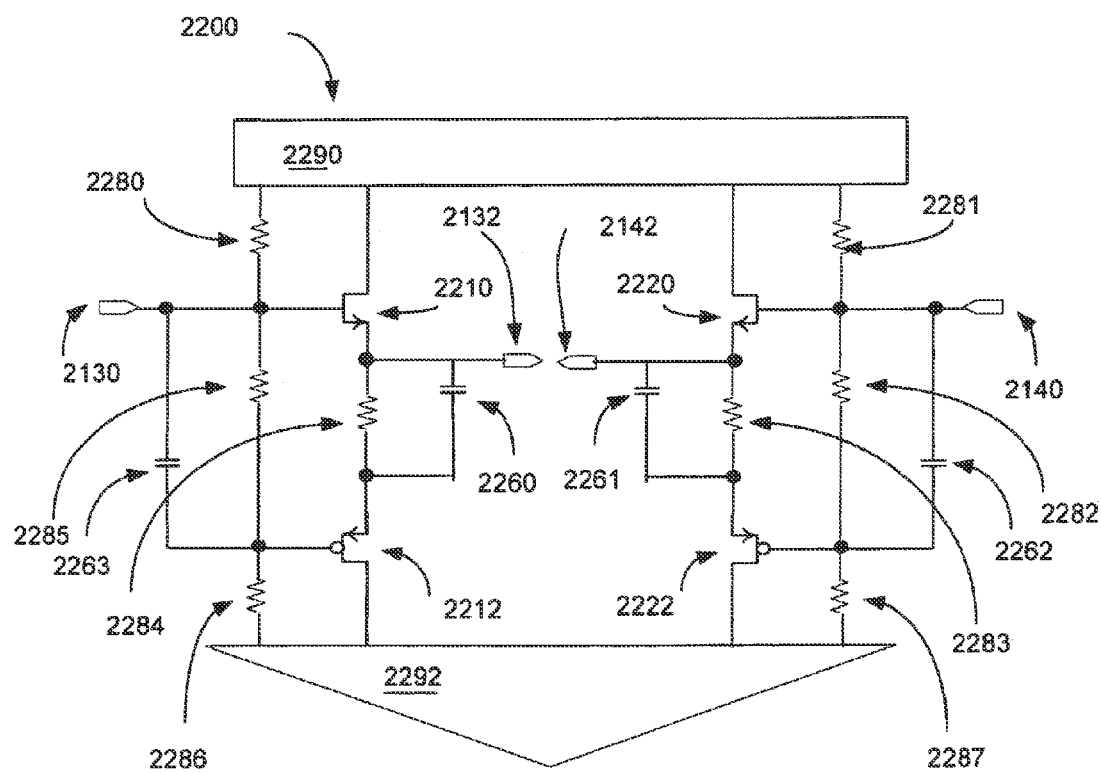
FIG. 22 is a schematic of an exemplary buffer stage according to one embodiment of the invention.

FIG. 22 is an exemplary buffer circuit that could be used for Buffer 2104. Buffer 2200 is powered by Power Supply 2290, grounds to Ground 2292, and includes n-type transistors N1 2210 and N2 2220, along with p-type transistors P1 2212 and P2 2222.

The drain for N1 2210 connects to Power Supply 2290. Power Supply 2290 also connects to Resistor 2280, which then connects to the gate of N1 2210. The gate of N1 2210 is also connected to In+ 2130. In+ 2130 and the gate of N1 2210 connect to Capacitor 2263, which then connects to the gate of P1 2212. The gates of N1 2210 and P1 2212 are also connected by Resistor 2285. The gate of P1 2212 is also connected to Ground 2292.

The source of N1 2210 is connected to Out+ 2132. The source of N1 2210 is also connected to Capacitor 2260, which then connects to the source of P1 2212. The sources of N1 2210 and P1 2212 are also connected by Resistor 2284. The drain of P1 2212 is connected to Ground 2292.

The drain for N2 2220 connects to Power Supply 2290. Power Supply 2290 also connects to Resistor 2281, which then connects to the gate of N2 2220. The gate of N2 2220 is also connected to In− 2140. In− 2140 and the gate of N2 2220 connect to Capacitor 2262, which then connects to the gate of P2 2222. The gates of N2 2220 and P2 2222 are also connected by Resistor 2282. The gate of P2 2222 is also connected to Ground 2292.

The source of N2 2220 is connected to Out-2142. The source of N2 2220 is also connected to Capacitor 2261, which then connects to the source of P2 2222. The sources of N2 2220 and P2 2222 are also connected by Resistor 2283. The drain of P2 2222 is connected to Ground 2292.

Resistor 2286 connects Ground 2292 to the gate of P1 2212 and to the sides of Capacitor 2263 and Resistor 2285 not connected to In+ 2130. Resistor 2287 connects Ground 2292 to the gate of P2 2222 and to the sides of Capacitor 2262 and Resistor 2282 not connected to In− 2140.

Buffer 2200 is not limited to use in circuits explicitly described herein. Buffer 2200 can be used in a wide variety of amplifiers having nested feedback circuits, and is particularly useful with nested feedback circuits that require internal and/or external switching of resistors in order to change the gain of the amplifier.

Figure 23:
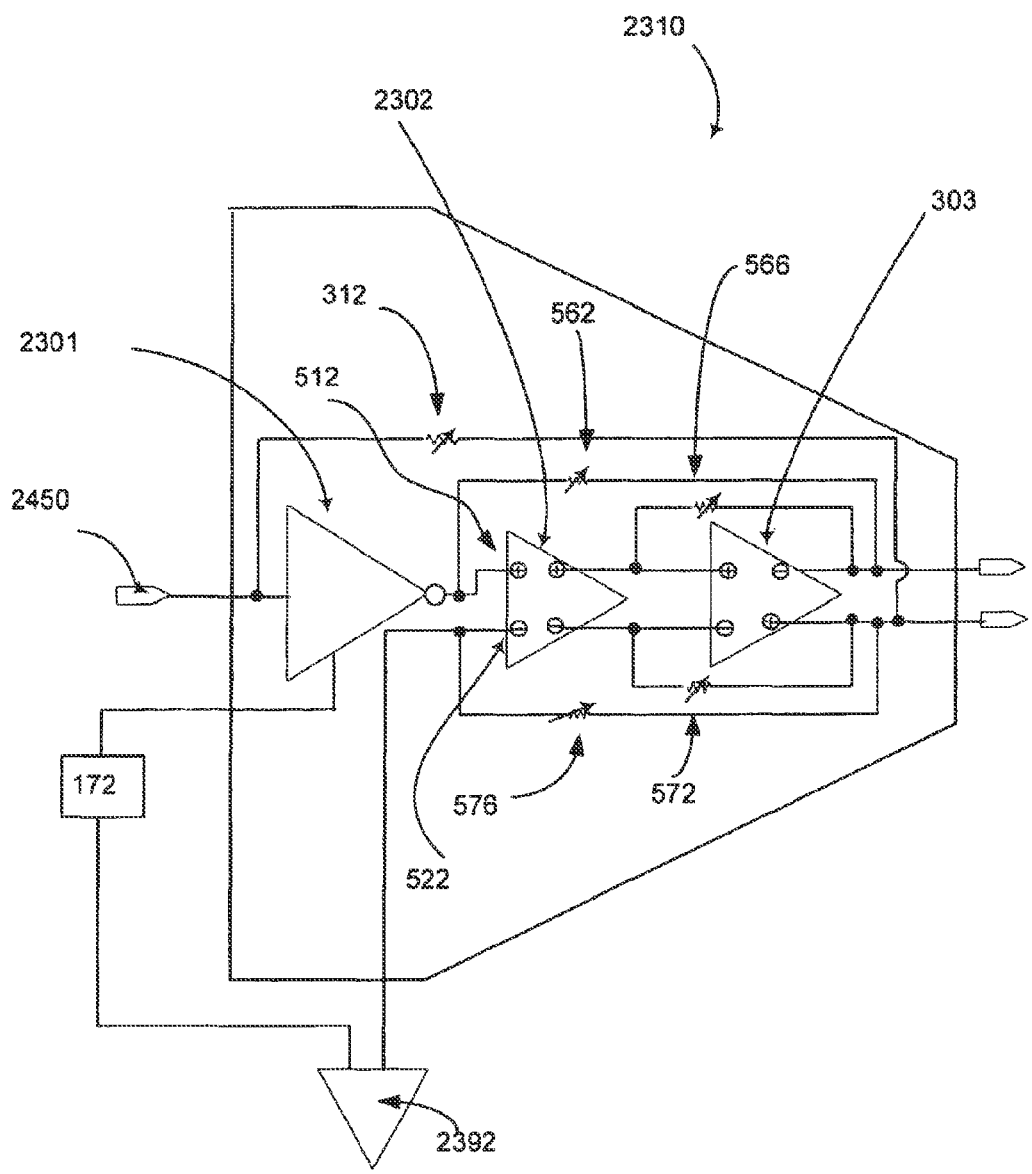
FIG. 23 is a schematic of an exemplary broadband voltage to voltage converter, having a first gain stage designed for single ended input, combined with a single ended to differential converter according to one embodiment of the invention.

FIG. 23 shows an exemplary implementation that has been designed expressly for single ended input, although in some embodiments, it may be replicated for use with differential input. LNA Core 2310 features three gain stages, several feedback components, and a bridge. As with other implementations, any number of bridges can be implemented. Feedback circuits (incorporating switchable resistors Rf 312, Rf 562, Rf 566, Rf 572 and Rf 576) operate as described previously. An exemplary bridge, in this case a single bridge incorporating Tune Block 172, operates as described previously. However, one leg of the bridge is connected to Ground 2392.

LNA Core 2310 receives single ended input at In+ 2450. Input is received into a single ended common source transconductance element operating as a first gain stage, Gm1 2301. Gm1 2301 also includes a bridge, which is grounded through Tune Block 172 as shown. In this example, Gm1 2301 provides inverted, single ended output.

The single ended output of Gm1 2301 is received into one of the inputs of a second gain stage, a common gate transconductance element Gm2 2302. In some aspects, Gm2 2302 is a cross coupled transconductance element, such as Gm2 1500 or Gm2 1600. In these cases, the cross coupling provides for the conversion of single ended input (e.g. at In− 512 in FIG. 23) to differential output. In this example, the other input to Gm2 2302 (i.e. In+ 522) is connected to Ground 2392.

The gain stages of LNA Core 2310 can also be described as a first stage comprising a voltage to current converter (i.e. Gm1 2301) and a second stage comprising a current to voltage converter (in this example, the combination of Gm2 2302 and Gm3 303), in which the current to voltage converter also performs a single ended to differential conversion. This combination of a voltage to current converter followed by a current to voltage converter is not limited to the number and/or type of gain stages shown in FIG. 23. Additionally, a variety of tuning options described elsewhere herein can be incorporated in any of these configurations to provide for tuned amplification.

Optionally, circuitry that has been developed for differential input can be modified for single ended input according to various embodiments.

Figure 24:
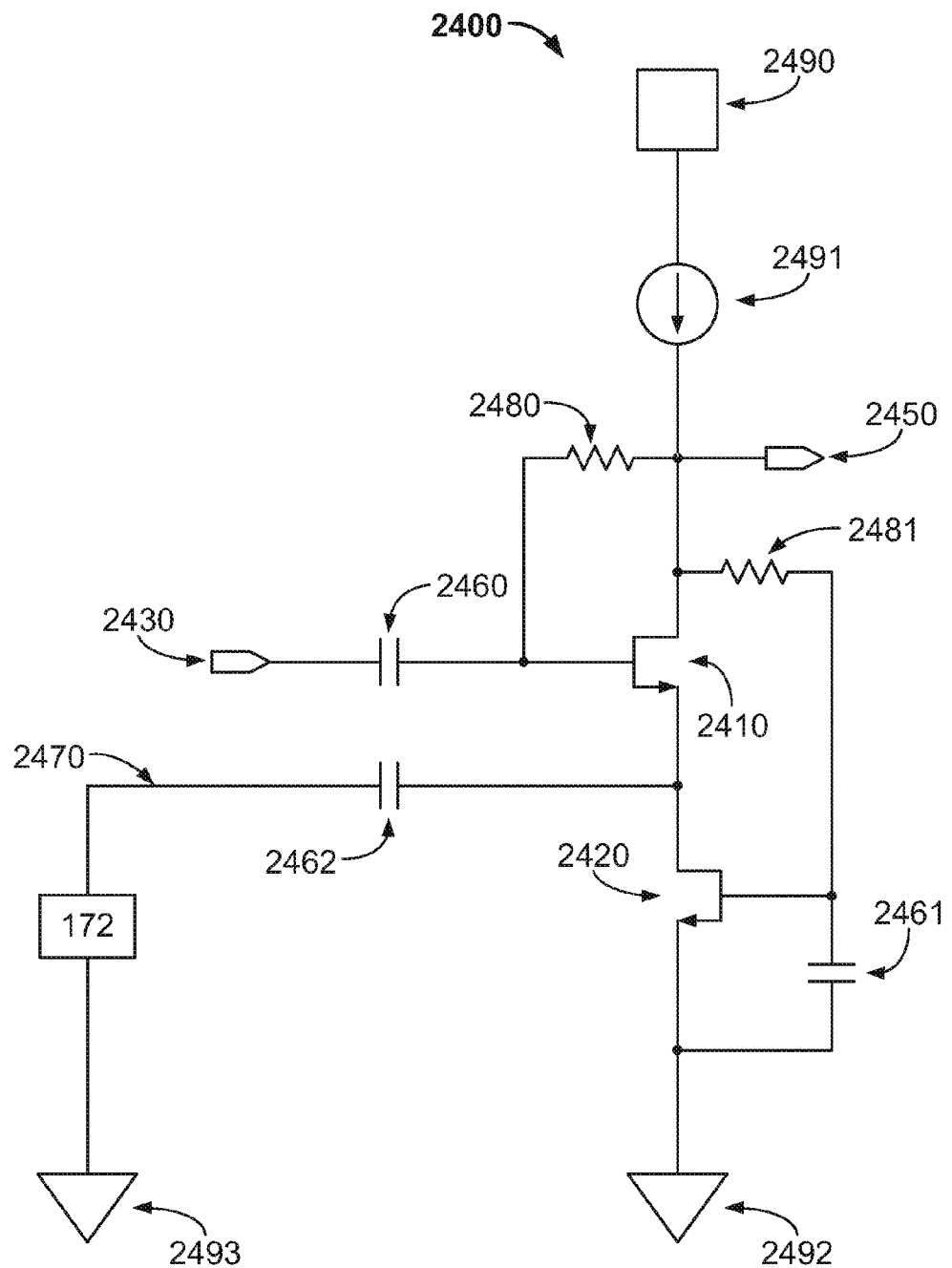
FIG. 24 is a schematic of an exemplary first gain stage for a single ended input according to one embodiment of the invention.

FIG. 24 is an example of a common source transconductance element that can be appropriate for use as Gm1 2301. Gm1 2400 is designed for single ended input, although it could be replicated to accommodate differential input. Gm1 2400 is powered by Power Supply 2490 and is grounded by Ground 2492. ISource 2491 supplies current. Signal input is received at In+ 2430, and output is via Out+ 2450.

In+ 2430 is connected to Capacitor 2460, which is then connected to the gate of n-type transistor N1 2410. The gate of N1 2410 is connected to the drain of N1 2410 via Resistor 2480. The drain of N1 2410 is also connected to ISource 2491, which is connected to Power Supply 2490. The drain of N1 2410 is also connected to Out+ 2450. The drain of N1 2410 is also connected to Resistor 2481, which then connects to the gate of n-type transistor N2 2420. The source of N1 2410 connects to the drain of N2 2420. The gate of N2 2420 is connected to the source of N2 2420 via Capacitor 2461. The source of N2 2420 is grounded to Ground 2492.

Bridge 2470 connects the source of N1 2410 and drain of N2 2420 to Capacitor 2462. Capacitor 2462 then connects to Tune Block 172. Tune Block 172 then connects to Ground 2493. Ground 2493 can be the same ground as Ground 2492, but in some embodiments it may be advantageous to make Ground 2493 the same ground as that grounded to by an antenna (not shown) used to receive signals. As described elsewhere, Tune Block 172 can have an impedance if tuned amplification is desired. For broadband amplification, Tune Block 172 can be a short circuit to Ground 2493. In this implementation, N1 2410 substantially provides amplification while N2 2420 substantially provides ground rejection.

In some aspects, N2 2420 can be replaced by a resistor. This replacement would obviously include the removal of the connection between the gate of N2 2420 and the junction between Capacitor 2461 and Resistor 22481.

Figure 25:
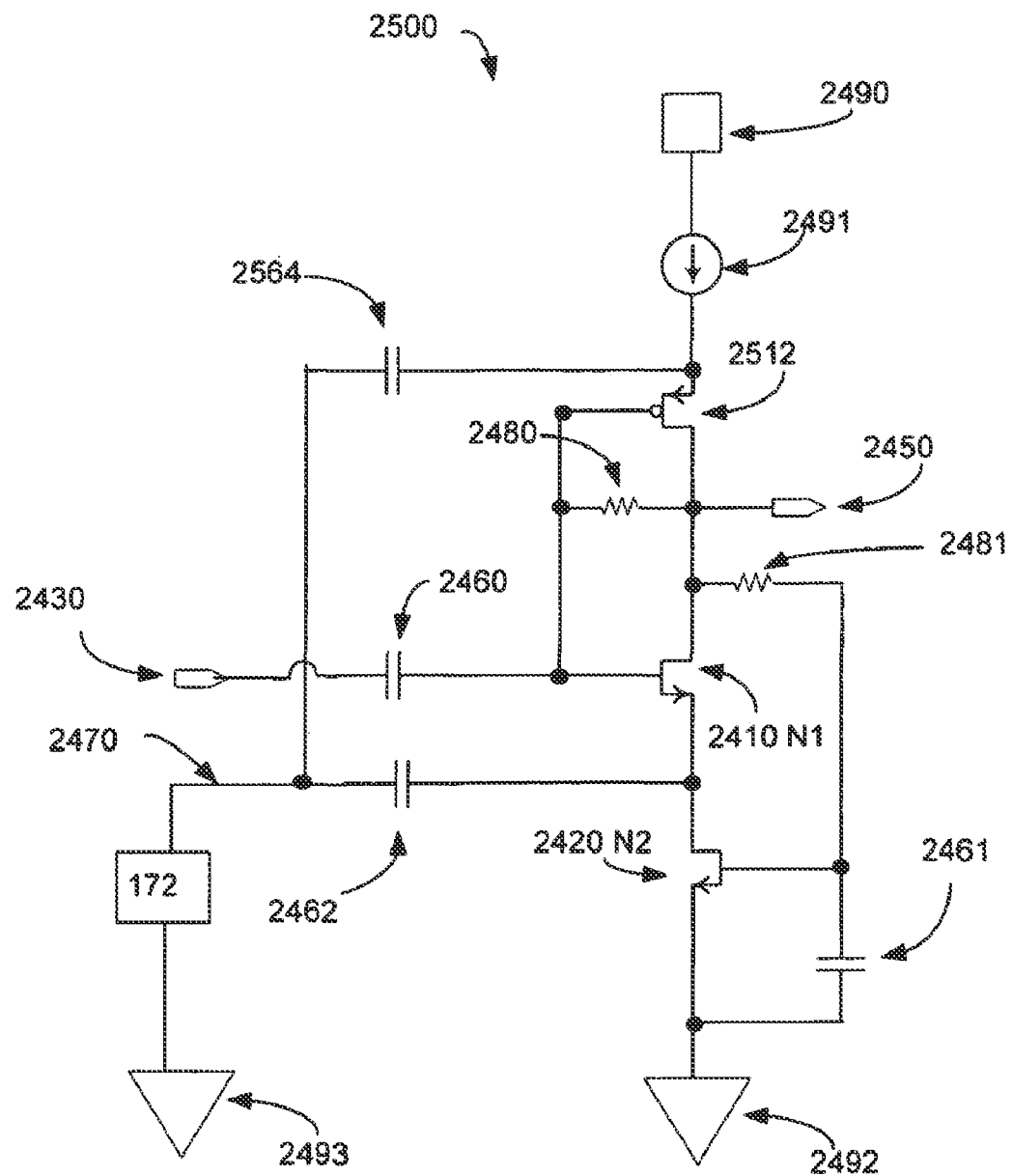
FIG. 25 is a schematic of another exemplary first gain stage for a single ended input according to one embodiment of the invention.

FIG. 25 is another example of a common source transconductance element that is appropriate for a single ended input into a first stage such as Gm1 2301. Gm1 2500 is designed for single ended input, although it could be replicated to accommodate differential input. Gm1 2500 shares several components with Gm1 2400, which are replicated in FIG. 25. However, Gm1 2500 differs in several aspects.

Gm1 2500 incorporates a third, p-type transistor, P1 2512. The source of P1 2512 connects to Power Supply 2491. The source of P1 2512 also connects to Capacitor 2564, which then connects to Bridge 2470 between Capacitor 2462 and Tune Block 172. Resistor 2480, Out+ 2450, Resistor 2481 and the drain of N1 2410 do not connect to ISource 2491 as they do in Gm1 2400. Instead, the drain of N1 2410 is connected to the drain of P1 2512. These drains are connected to Out+ 2450. These drains are also connected to Resistor 2481, which then connects to the gate of N2 2420 and to Capacitor 2461. The drains of N1 2410 and P1 2512 also connect to Resistor 2480, which then connects to the gate of P1.2512 and the gate of N1 2410. This implementation features a combination of n-type and p-type amplification.

FIG. 26 shows a schematic diagram of several embodiments. Whereas other figures showed differential versions of separate gain stages, bias circuits, transconductance elements, feedback circuits and the like on separate figures, FIG. 26 incorporates several of these features into one schematic. This example is not meant to be limiting. Rather, it is just an alternate way to show how different components can interact. For simplicity, FIG. 26 is drawn as a "half circuit" that can function as a broadband current to voltage converter with a single ended input. However, the circuit in FIG. 26 is drawn in a way to suggest replication (e.g. mirroring of the circuit) to create a circuit for differential input, and several optional modifications directed toward this replication are included in the description of FIG. 26. FIG. 26 also shows one combination of n-type and p-type transistors, NLoad and PLoad, and bias circuitry that can create a linear transconductance element (when mirrored to make a differential circuit).

FIG. 26 is a schematic of an inverting, broadband current to voltage converter incorporating first and second gain stages, bias circuits, feedback circuits, transistor loading circuits and optional cross coupling circuits. BBI2V 2600 is powered by Power Supply 2690 and grounds to Ground 2692. BBI2V 2600 features n-type transistors N1 2610, N2 2620, N3 2630, N4 2640 and N5 2650, along with p-type transistors P1 2612, P2 2622, P3 2632 and P4 2642.

The source of P2 2622 connects to Power Supply 2690. The gate of P2 2622 connects to Resistor 2680, which then connects to the drain of P2 2622. The gate of P2 2622 also connects to optional Capacitor 2668, which then connects to Power Supply 2690 and the source of P2 2622. The drain of P2 2622 is also connected to the drain of N4 2640, and both of these drains are connected to the gate of P4 2642.

The source of N4 2640 connects to the source of P3 2632. These sources are connected to In 2412, and also connect to Resistor 2685, which then connects to Out 2550. The drain of P3 2632 connects to the drain of N3 2630. The drains of P3 2632 and N3 2630 connect to the gate of N5 2650. These drains also connect to Resistor 2681, which then connects to the gate of N3 2630. The source of N3 2630 connects to Ground 2692. The gate of N3 2630 also connects to optional Capacitor 2666, which then connects to Ground 2692 and the source of N3 2630.

Gate bias for N4 2640 is via N1 2610, and gate bias for P3 2632 is via P1 2612. The drain of N1 2610 is connected to current source ISource 2691, which is connected to Power Supply 2690. The drain of N1 2610 is also connected to the gate of N1 2610. The gate and drain of N1 2610 are connected to the gate of N4 2640 via optional Resistor 1483 (options discussed below).

The source of N1 2610 is connected to the source of P1 2612. These sources are also connected to Resistor 2682, which connects to the gate of N2 2620. This junction between Resistor 2682 and the gate of N2 2620 is also connected to Capacitor 2664, which then connects to Ground 2692. The gate of P1 2612 is connected to the drain of P1 2612. The gate and drain of P1 2612 are connected to the gate of P3 2632 through optional Resistor 1482. The drain of P1 2612 is connected to the drain of N2 2620. The source of N2 2620 is connected to Ground 2692.

The source of P4 2642 is connected to Power Supply 2690. The drain of P4 2642 connects to the drain of N5 2650. These drains are connected to both Out 2550 and to Resistor 2685 on the side of Resistor 2685 opposite the connection to In 2412. The source of N5 2650 connects to Ground 2692.

The gate of P4 2642 is connected to the gate of N5 2650 via a serial connection of pairs of a resistor and capacitor connected to each other in parallel (as shown in FIG. 26). The gate of P4 2642 is connected to both Resistor 2683 and Capacitor 2660. The opposite sides of both Resistor 2683 and Capacitor 2660 are connected to Junction 2699. The gate of N5 2650 is connected to both Resistor 2684 and Capacitor 2662. The opposite sides of both Resistor 2684 and Capacitor 2662 are connected to Junction 2699. Junction 2699 also connects to Resistor 2686, which then connects to the drains of both N5 2650 and P4 2642.

FIG. 26 shows examples of two separate gain stages. Although the embodiments shown in FIG. 26 can be used as is, it may be instructive to describe several of the features of BBI2V 2600 in the context of other parts of this description. Thus, the first gain stage of BBI2V 2600 (a common gate linear transconductance element) can be described as a second gain stage Gm2 for illustrative purposes. Similarly, the second gain stage of BBI2V 2600 (a common source transconductance element) can be described as a third gain stage Gm3 for illustrative purposes. Following this illustrative nomenclature, BBI2V 2600 includes a second gain stage Gm2 (including N4 2640 and P3 2632), bias circuit (including N1 2610, N2 2620 and P1 2612), third gain stage Gm3 (including P4 2642 and N5 2650), NLoad circuit (including N3 2630 and Resistor 2681), PLoad circuit (including P2622 and Resistor 2680), cross coupling circuit (including Capacitors 1560 and 1568 and Resistors 1483 and 1482) and feedback components (including Resistors 2683, 2684, 2685, 2686 and Capacitors 2660 and 2662, along with optional Capacitors 2666 and 2668). FIG. 26 shows slightly different embodiments of the common gate and common source transconductance elements comprising the gain stages. These embodiments of transconductance elements are not restricted to use in the context of BBI2V 2600.

For some differential input applications, Capacitors 2666 and 2668 may not be required. However for single ended applications, the incorporation Capacitors 2666 and 2668 may be advantageous. If a "single" version of BBI2V 2600 is to be used "as is" for a single ended input, or if the replicated or doubled version of BBI2V 2600 is to be used for single ended input (e.g. converting single ended input into a differential output), including Capacitors 2666 and 2668 can be advantageous.

For simplification of this alternate view of several embodiments, BBI2V 2600 is shown as a "half circuit" as previously described. However, replication of this BBI2V 2600 foreseen, and the replicated version could incorporate a cross coupling circuit if either noise cancellation or single ended to differential conversion is desired of the replicated circuit (e.g. dual version of BBI2V 2600). Thus, several optional features are shown on FIG. 26 that can be used to create cross coupling circuits if so desired. Optional Resistors 1482 and 1483, along with optional Capacitors 1560 and 1568 would be incorporated as shown to create a cross coupled circuit (comprising two mirrored copies of BBI2V 2600). The sides of Capacitors 1560 and 1568 not shown would then be connected to the sources of the mirrored circuit. Similarly, the mirrored version (having the same replicated versions of Resistors 1482 and 1483, along with Capacitors 1560 and 1568) would connect to In 2412 on FIG. 26.

FIG. 26 provides additional information directed toward several embodiments. The circuitry including N1 2610, N2 2620 and P1 2612 is a bias circuit, and this bias circuit provides gate bias to N4 2620 and P3 2632. The first gain stage in BBI2V 2600 (which would correspond to a second gain stage or Gm2 stage in other LNA embodiments) includes circuitry including N4 2620 and P3 2632. One embodiment of NLoad 630 is shown in the circuitry which loads N4 2640. This loading circuitry includes P2 2622, Resistor 2680 and optional Capacitor 2668. In some applications, Capacitor 2668 can help ensure that the resistance presented by the loading circuit is sufficiently high. One embodiment of PLoad 632 is shown in the circuitry which loads P3 2632. This loading circuitry includes N3 2630, Resistor 2681 and Capacitor 2666.

For a replicated (i.e. mirrored) version of BBI2V 2600, the combination of loading circuits, bias circuits and gain circuits forms an embodiment of a broadband current to voltage converter capable of receiving (e.g.) a differential input.

A variety of resistive circuits and/or resistors could be used for NLoad and PLoad circuitry, as long as they are sufficiently resistive, supply current, and are not current limiting. However the circuitry shown in FIG. 26 may provide for relatively increased headroom as compared to other loads (e.g. resistors).

In some cases, it may be advantageous or efficient to combine the functionality of several embodiments onto one circuit or set of circuits. In addition to functioning as loading circuits, the circuits associated with P2 2622 and N3 2630 also act as bias circuits for the final gain stage. Thus, bias for P4 2642 is set by circuitry including P2 2622 (via the drain of P2 2622), and the bias for N5 2650 is set by circuitry including N3 2630 (via the drain of N3 2630).

Figure 27:
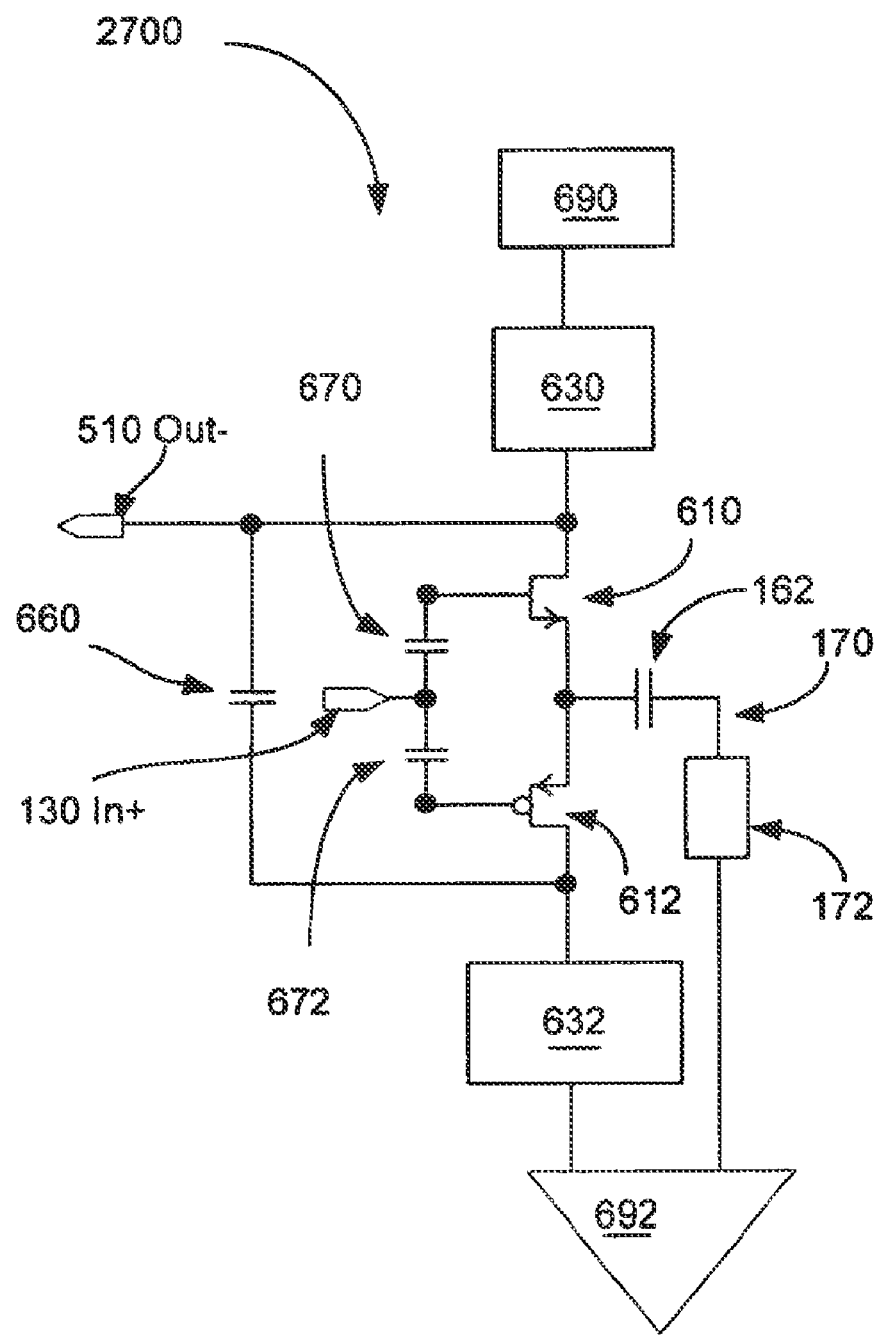
FIG. 27 is a schematic of a common source transconductance element according to one embodiment of the invention.

FIG. 27 is a schematic of a common source transconductance element according to one embodiment of the invention. For clarity, the sources of DC gate bias are not shown. Various components of CSTE 2700 have been described previously. Certain embodiments of circuits such as the one shown in FIG. 27 may not require a current source.

Figure 28:
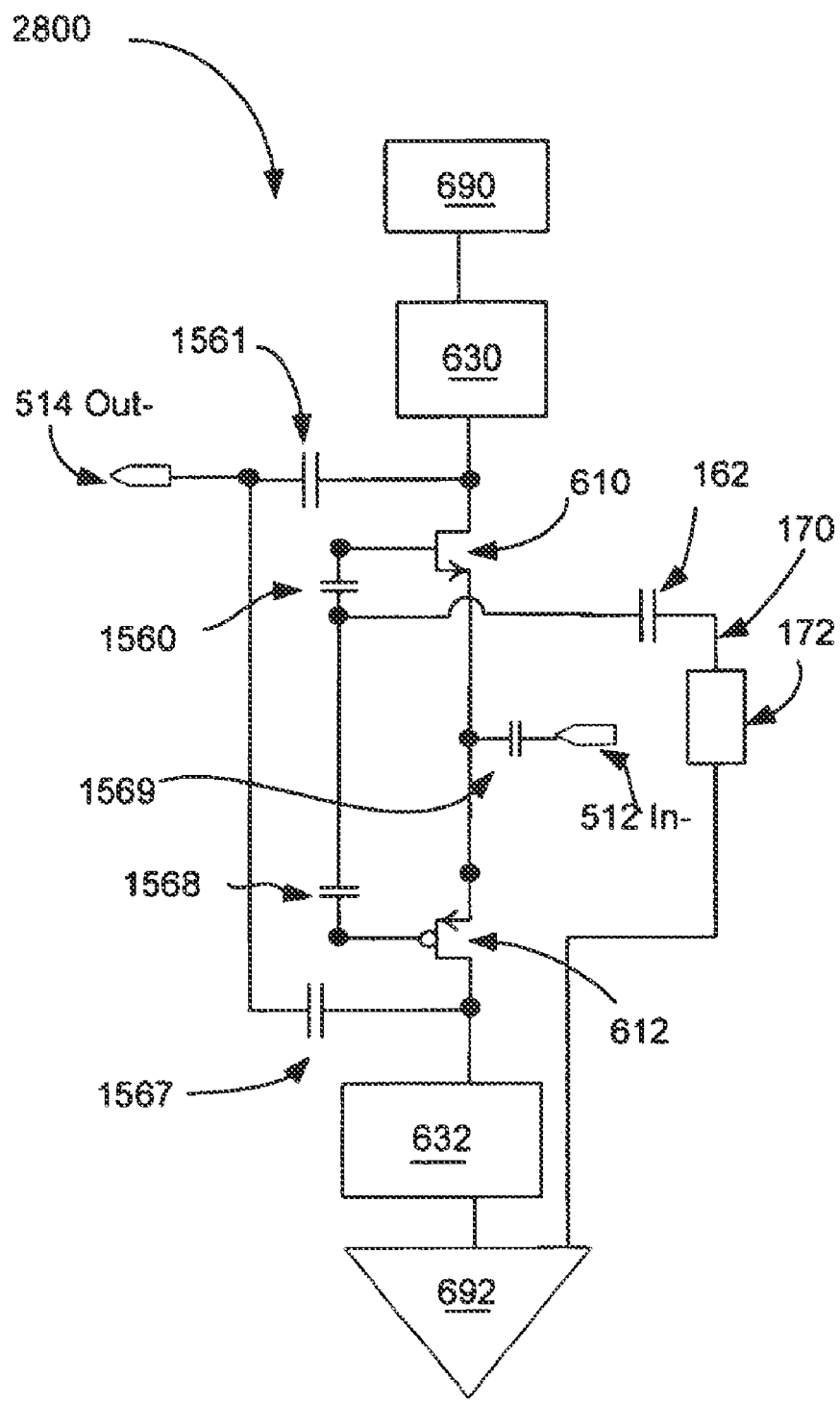
FIG. 28 is a schematic of a common gate transconductance element according to one embodiment of the invention.

FIG. 28 is a schematic of a common gate transconductance element according to one embodiment of the invention. For clarity, the sources of DC gate bias are not shown. Various components of CSTE 2800 have been described previously. Certain embodiments of circuits such as the one shown in FIG. 27 may not require a current source.

Figure 29A:
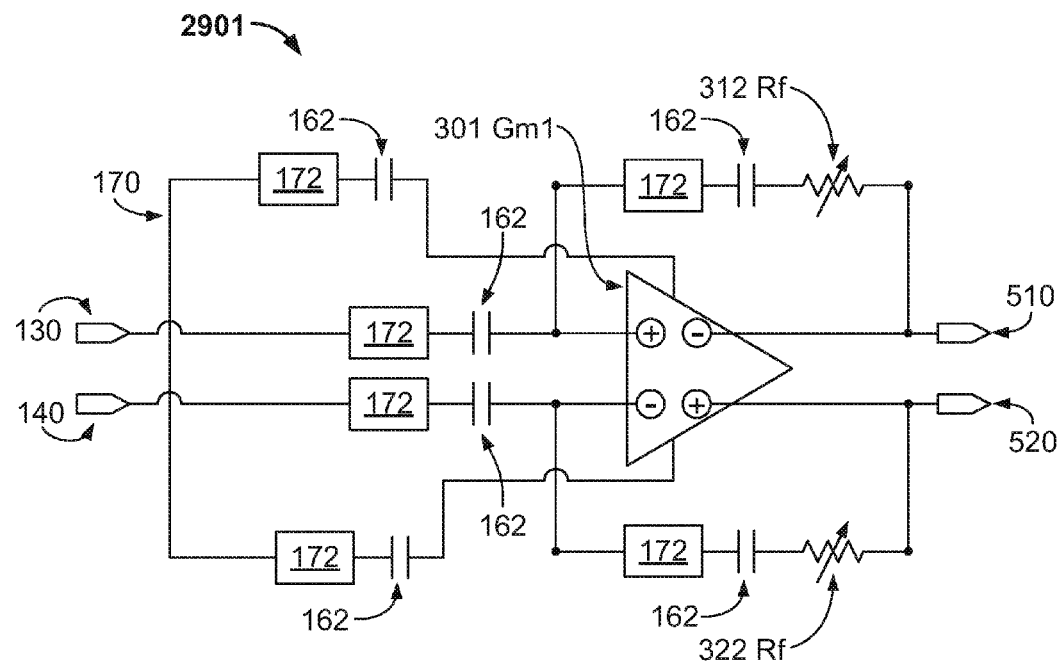
FIG. 29A is a block diagram of a common source transconductance element incorporating a bridge and feedback circuits according to one embodiment of the invention.

FIG. 29A is a block diagram of a common source transconductance element incorporating a bridge and feedback circuits. CSTE 2901 shows several optional locations for the incorporation of tune blocks and capacitors for providing tuning if desired. The exemplary transconductance element Gm1 301 is configured to receive a differential input in this example. The connections between Bridge 170 and Gm1 301 are shown in a different part of Gm1 301 than other diagrams. This difference is for illustrative clarity only.

Figure 29B:
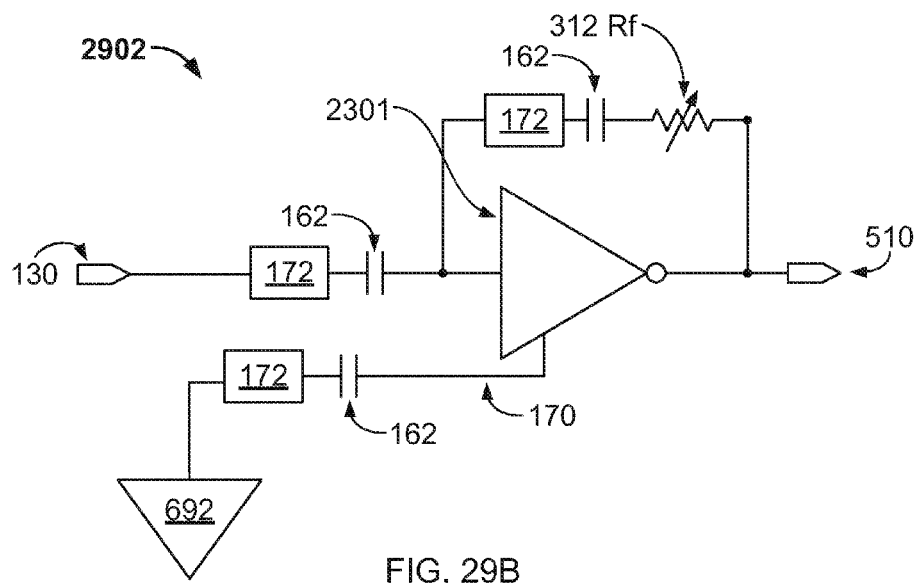
FIG. 29B is a block diagram of another common source transconductance element incorporating a bridge and feedback circuits according to one embodiment of the invention.

FIG. 29B is a block diagram of a common source transconductance element incorporating a bridge and feedback circuit. CSTE 2902 shows several optional locations for the incorporation of tune blocks and capacitors for providing tuning if desired. The exemplary transconductance element Gm1 2301 is configured to receive a single ended input and provide differential output in this example. The connection between Bridge 170 and Gm1 2301 is shown in a different part of Gm1 2301 than other diagrams. This difference is only for illustrative clarity.

Figure 30:
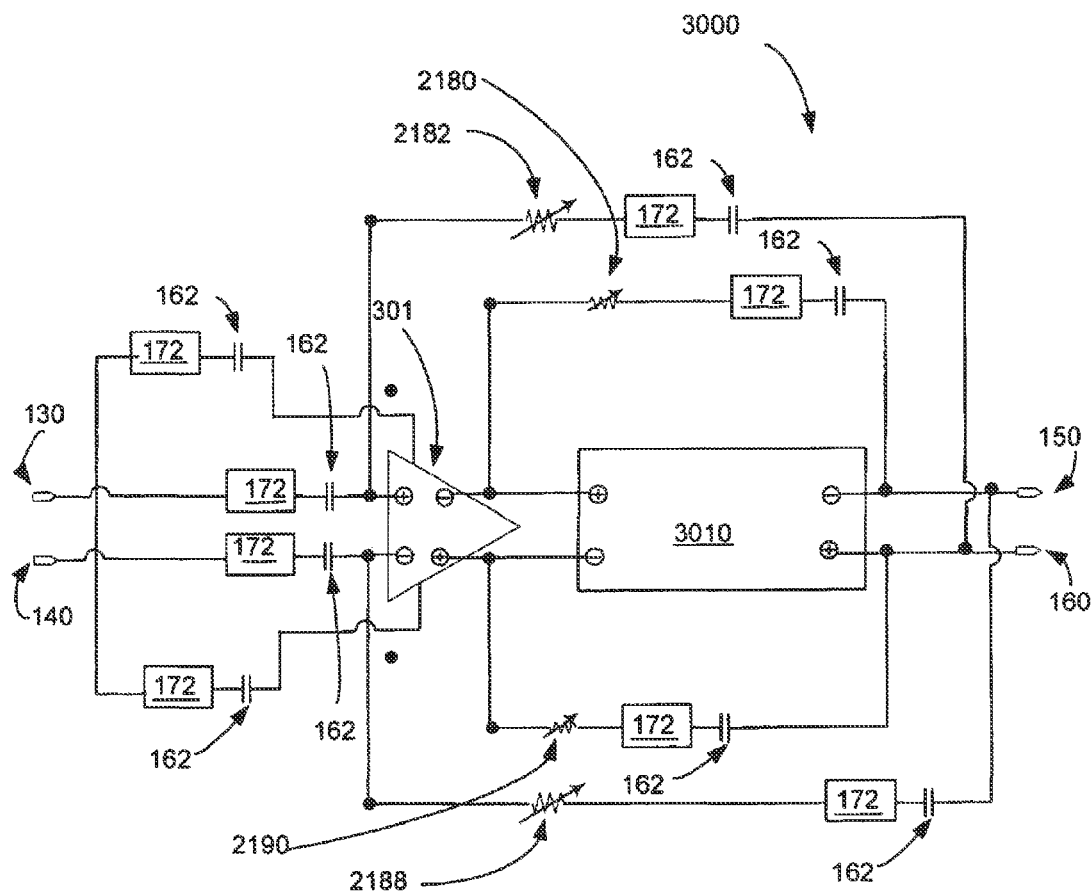
FIG. 30 is a block diagram of a broadband voltage to voltage converter according to one embodiment of the invention.

FIG. 30 is a block diagram of a broadband voltage to voltage converter according to an embodiment. BBV2V 3000 includes Gm1 301 and broadband voltage to voltage converter BBI2V 3010. BBV2V 3000 also shows several feedback circuits and a bridge. This block diagram illustrates several options for the incorporation of tuning circuits if so desired—into input circuits, into the bridge, and into feedback circuits.

Figure 31A:
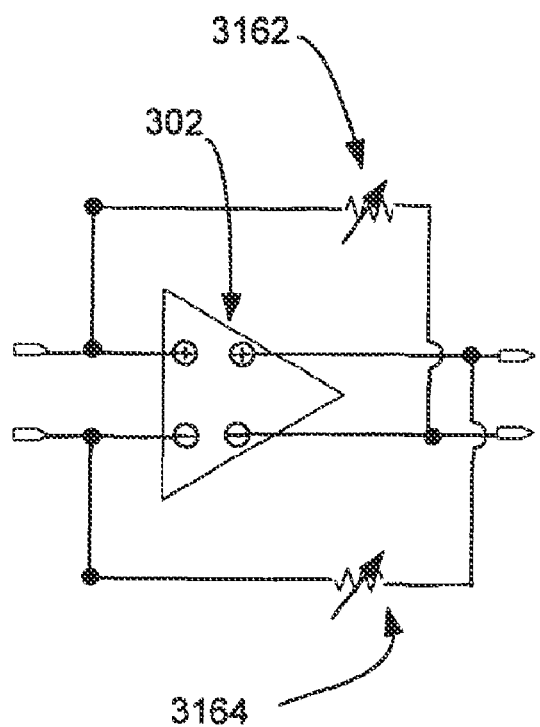
FIG. 31A is a block diagram showing a combination of an exemplary common gain transconductance element with a feedback circuit.

FIG. 31A is a block diagram showing a combination of an exemplary common gain transconductance element with a feedback circuit. Switchable feedback resistors Rf 3162 and Rf 3164 provide feedback between each input of Gm2 302 and the output having opposite polarity.

Figure 31B:
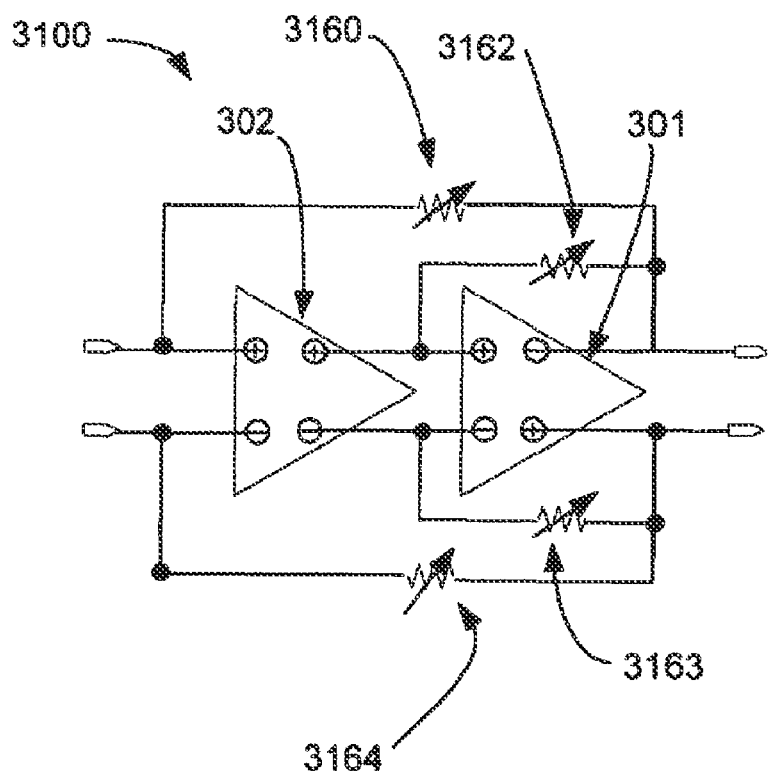
FIG. 31B is a block diagram showing an exemplary broadband voltage to voltage converter (e.g. for use in BBI2V 3010) incorporating feedback circuits.

FIG. 31B is a block diagram showing an exemplary broadband voltage to voltage converter (e.g. for use in BBI2V 3010) incorporating feedback circuits. BBI2V 3100 includes a common gain transconductance element Gm2 302 and a common source transconductance element Gm1 301. Input is received by Gm2 302, which then sends signal to Gm1 301, which then creates output. Switchable feedback resistors Rf 3160, 3162, 3163 and 3164 are incorporated into feedback circuits connecting the each input of each transconductance element to the output having opposite polarity.

In some embodiments, circuitry such as that shown in FIGS. 31A and 31B may offer noise reduction, reduced input resistance, and the conversion of single ended input to a differential output. Cross coupling may also be incorporated into such circuits.

The above description is illustrative and not restrictive. Many variations of the invention will become apparent to those of skill in the art upon review of this disclosure. The scope of the invention should, therefore, be determined not with reference to the above description, but instead should be determined with reference to the appended claims along with their full scope of equivalents.

The invention claimed is:
1. A current to voltage converter comprising:
   a common gate transconductance element having at least one input and one output;
   a common source transconductance element having at least one input and one output, the common source transconductance element connected to the common gate transconductance element;
   a feedback circuit including a resistor, the feedback circuit connecting any input having a polarity to any output having an opposite polarity;

a buffer having at least one input and one output, wherein the buffer is connected to any of the transconductance elements; and a tune block having an impedance, connected to any input, output or feedback circuit.

2. The current to voltage converter of claim 1, further comprising a substrate upon which the transistors are fabricated, wherein the tune block is external to the substrate.

3. A current to voltage converter comprising:

a common gate transconductance element having at least one input and one output;

a common source transconductance element having at least one input and one output, the common source transconductance element connected to the common gate transconductance element;

a feedback circuit including a resistor, the feedback circuit connecting any input having a polarity to any output having an opposite polarity; and a tune block having an impedance, the tune block serially connected to any input, output or feedback circuit.

4. The current to voltage converter of claim 3, further comprising a substrate upon which the transistors are fabricated, wherein the tune block is external to the substrate.

5. A low noise amplifier comprising:

a first common source transconductance element including a tune block having an impedance, the first common source transconductance element having an input and an output;

a common gate transconductance element in connection with the first common source transconductance element, the common gate transconductance element having an input and an output;

a second common source transconductance element in connection with the common gate transconductance element, the second common source transconductance element having an input and an output; and at least one a feedback circuit including a resistor, the feedback circuit connecting any input to any output.

6. The low noise amplifier of claim 5, further comprising a buffer having at least one input and one output, the buffer connected to any of the transconductance elements.

* * * * *